US012564098B2

(12) United States Patent
Hong et al.

(10) Patent No.: US 12,564,098 B2
(45) Date of Patent: Feb. 24, 2026

(54) DISPLAY APPARATUS HAVING DISPLAY MODULE AND MANUFACTURING METHOD THEREOF

(71) Applicant: SAMSUNG ELECTRONICS CO., LTD., Suwon-si (KR)

(72) Inventors: Soonmin Hong, Suwon-si (KR);
Seongho Son, Suwon-si (KR);
Jongsung Lee, Suwon-si (KR);
Gunwoo Kim, Suwon-si (KR);
Seonghwan Shin, Suwon-si (KR);
Changjoon Lee, Suwon-si (KR);
Tackmo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 792 days.

(21) Appl. No.: 17/896,738

(22) Filed: Aug. 26, 2022

(65) Prior Publication Data

US 2023/0126724 A1 Apr. 27, 2023

Related U.S. Application Data

(63) Continuation of application No. PCT/KR2022/012760, filed on Aug. 25, 2022.

(30) Foreign Application Priority Data

Oct. 27, 2021 (KR) ........................ 10-2021-0144982

(51) Int. Cl.
*H01L 25/16* (2023.01)
*H01L 23/60* (2006.01)
(Continued)

(52) U.S. Cl.
CPC ............ *H01L 25/167* (2013.01); *H01L 23/60* (2013.01); *H10H 20/855* (2025.01);
(Continued)

(58) Field of Classification Search
CPC ....... H01L 25/167; H01L 23/60; H01L 24/05; H01L 24/32; H01L 24/83; H01L 25/165;
(Continued)

(56) References Cited

U.S. PATENT DOCUMENTS 8,634,040 B2 1/2014 Ahn et al.
10,405,098 B2 9/2019 Yoon et al.
(Continued)

FOREIGN PATENT DOCUMENTS

KR 10-2011-0119007 A 11/2011
KR 10-2013-0112147 A 10/2013
(Continued)

OTHER PUBLICATIONS

International Search Report (PCT/ISA/210) and Written Opinion (PCT/ISA/237) dated Dec. 20, 2022 issued by the International Searching Authority in International Application No. PCT/KR2022/012760.
(Continued)

*Primary Examiner* — Fernando L Toledo
*Assistant Examiner* — Shawn Shaw Muslim
(74) *Attorney, Agent, or Firm* — Sughrue Mion, PLLC

(57) ABSTRACT

A display module includes: a substrate including a mounting surface on which a plurality of inorganic light-emitting devices are mounted, a side surface, and a rear surface being opposite to the mounting surface; a front cover bonded with the mounting surface and covering the mounting surface; a metal plate bonded with the rear surface; a side cover surrounding the side surface; and a side end member covering at least one portion of a side end of the side cover, and including a first portion being in contact with and grounded to the metal plate and a second portion connected to the first portion and positioned on the side end of the side cover.

19 Claims, 12 Drawing Sheets

(51) Int. Cl.
  H10H 20/855 (2025.01)
  H10H 20/857 (2025.01)
  *H01L 23/00* (2006.01)

(52) U.S. Cl.
  CPC .......... H10H 20/857 (2025.01); *H01L 24/05* (2013.01); *H01L 24/32* (2013.01); *H01L 24/83* (2013.01); *H01L 25/165* (2013.01); *H01L 2224/05572* (2013.01); *H01L 2224/05573* (2013.01); *H01L 2224/32145* (2013.01); *H01L 2224/83201* (2013.01); *H01L 2224/83851* (2013.01)

(58) Field of Classification Search
  CPC . H01L 2224/05572; H01L 2224/05573; H01L 2224/32145; H01L 2224/83201; H01L 2224/83851; H01L 25/075; H01L 25/0753; H10H 20/855; H10H 20/857; G09F 9/302; G09F 9/33; G09F 9/3023; H10D 86/00; H10D 86/40; H10D 86/60
  See application file for complete search history.

(56) References Cited

U.S. PATENT DOCUMENTS

| | | | |
|---|---|---|---|
| 11,263,933 | B2 | 3/2022 | Han et al. |
| 11,467,625 | B2 | 10/2022 | Ryu et al. |
| 11,626,468 | B2 | 4/2023 | Kwon et al. |
| 12,046,589 | B2 * | 7/2024 | Shin .......................... G09G 5/18 |
| 12,278,226 | B2 * | 4/2025 | Hong ................... H10H 29/142 |
| 2017/0005083 | A1 | 1/2017 | Choi et al. |
| 2018/0190747 | A1 | 7/2018 | Son et al. |
| 2020/0161405 | A1 | 5/2020 | Kim et al. |
| 2021/0183837 | A1 | 6/2021 | Shin et al. |
| 2021/0202449 | A1 | 7/2021 | Shin et al. |
| 2021/0202686 | A1 | 7/2021 | Jeon et al. |
| 2022/0199594 | A1 * | 6/2022 | Shin ................... H01L 25/0753 |
| 2022/0415977 | A1 | 12/2022 | Lee |
| 2023/0027649 | A1 * | 1/2023 | Hong ....................... G09F 9/33 |

FOREIGN PATENT DOCUMENTS

| | | |
|---|---|---|
| KR | 10-2019-0046684 A | 5/2019 |
| KR | 10-2019-0051121 A | 5/2019 |
| KR | 10-2020-0004174 A | 1/2020 |
| KR | 10-2020-0010821 A | 1/2020 |
| KR | 10-2020-0036029 A | 4/2020 |
| KR | 10-2020-0137793 A | 12/2020 |
| KR | 10-2021-0063056 A | 6/2021 |
| KR | 10-2021-0075820 A | 6/2021 |
| KR | 10-2021-0083875 A | 7/2021 |
| WO | 2019-047151 A1 | 3/2019 |

OTHER PUBLICATIONS

Communication dated Oct. 4, 2024, issued by European Patent Office in European Patent Application No. 22887315.4.

* cited by examiner

30A

DISPLAY APPARATUS HAVING DISPLAY MODULE AND MANUFACTURING METHOD THEREOF

CROSS-REFERENCE TO RELATED APPLICATION

This application is a Continuation Application of P.C.T. Application number PCT/KR2022/012760, filed on Aug. 25, 2022, that claims priority to Korean Patent Application No. 10-2021-0144982, filed on Oct. 27, 2021 in the Korean Intellectual Property Office, the disclosures of which are incorporated by reference herein in its entirety.

BACKGROUND

1. Field

The disclosure relates to a display apparatus for displaying an image by coupling modules in which self-emissive inorganic light-emitting devices are mounted on substrates.

2. Description of the Related Art

A display apparatus is an output apparatus for visually displaying images and data information, such as characters, figures, etc.

Traditionally, a liquid crystal panel requiring a backlight or an organic light-emitting diode (OLED) panel configured with a film of an organic compound that itself emits light in response to current has been used as a display device. However, a traditional the liquid crystal panel has a slow response time and high power consumption, and requires a backlight because it cannot itself emit light. Accordingly, it is difficult to achieve a compact the liquid crystal panel. Also, while the traditional OLED panel does not require a backlight and can achieve a small thickness because it does not require a backlight, the traditional OLED panel is vulnerable to a burn-in phenomenon (in which, when the same an area of a screen is changed after being statically displayed for an extended period time, ghosting in that specific area of the screen remains due to the short lifespan of the sub pixels.

SUMMARY

To overcome these deficiencies, a micro light-emitting diode (referred to as a micro LED or a μLED) panel that uses inorganic light-emitting devices mounted on substrates as pixels may be utilized.

The micro light-emitting diode panel (hereinafter, referred to as a micro LED panel), which is a flat display panel, is configured with a plurality of inorganic LEDs each having a size of 100 micrometers or less.

The micro LED panel does not cause the burn-in phenomenon of traditional OLEDs as inorganic light-emitting devices that are self-emissive devices, while having excellent brightness, resolution, consumption power, and durability.

The micro LED panel provides better contrast, response time, and energy efficiency than the traditional LCD panel requiring the backlight. Micro LEDs which are inorganic light-emitting devices have higher brightness, higher light-emitting efficiency, and a longer lifespan than traditional OLEDs although both the OLEDs and micro LEDs have high energy efficiency.

Also, display modules can be manufactured in unit of substrates by arranging LEDs in unit of pixels on circuit boards, and accordingly, micro LED panels can be manufactured with various resolutions and screen sizes according to users' orders.

Therefore, it is an aspect of the disclosure to provide a display apparatus and a manufacturing method thereof, more particularly, a display module suitable for enlargement and a technical feature about protection of the display module against static electricity in a display apparatus including the display module.

Additional aspects of the disclosure will be set forth in part in the description which follows and, in part, will be obvious from the description, or may be learned by practice of the disclosure.

In accordance with a concept of the disclosure, a display module includes: a substrate including a mounting surface on which a plurality of inorganic light-emitting devices are mounted, a side surface, and a rear surface being opposite to the mounting surface; a front cover bonded with the mounting surface and covering the mounting surface; a metal plate bonded with the rear surface; a side cover covering the side surface; and a side end member covering at least one portion of a side end of the side cover, and including a first portion being in contact with and grounded to the metal plate and a second portion connected to the first portion and positioned on the side end of the side cover.

A conductivity of the side end member may be greater than a conductivity of the side cover.

An end of the first portion in a direction in which the mounting surface faces may be spaced at a distance from a front end of the front cover in the direction in which the mounting surface faces.

The end of the first portion in the direction in which the mounting surface faces may be positioned behind a light-emitting surface of the plurality of inorganic light-emitting devices in the direction in which the mounting surface faces.

The distance between the end of the first portion and the front end of the front cover may be ten times longer than a thickness of the side end member.

The side end member may be formed with a color of black.

The side end member may be made of metal.

The side end member may include a first layer bonded with the side cover, a second layer grounded to the metal plate, and a third layer formed with a color of black, and the first layer, the second layer, and the third layer may be sequentially layered outward from the side surface.

At least one part of the first portion of the side end portion may be positioned between the side surface and the side cover.

The side cover may include a light absorbing material.

The side cover may be formed of a nonconductive material.

The front cover is provided to extend to an area outside the mounting surface.

The side cover extends from an upper portion of the metal plate to a lower end of the area outside the mounting surface of the front cover in the direction which the mounting surface faces, to seal the side surface from outside.

A side end of the front cover and a side end of the side cover may be linearly aligned.

The side surface may correspond to four edges of the mounting surface, the front cover may extend up to an outer location than the four edges of the mounting surface, the side cover may surround the side surface, and a lower surface of the front cover, corresponding to outside of the mounting surface, along the four edges of the mounting surface, and the side end member may surround at least one portion of the side cover, along the four edges of the mounting surface.

According to a concept of the disclosure, a display apparatus includes a display module array of a plurality of display modules are arranged in a two-dimensional matrix, each of the plurality of display modules including: a substrate including a mounting surface on which a plurality of inorganic light-emitting devices are mounted, a side surface, and a rear surface being opposite to the mounting surface; a front cover bonded with the mounting surface and covering the mounting surface; a metal plate bonded with the rear surface; a side cover surrounding the side surface; and a side end member covering at least one portion of a side end of the side cover, and including a first portion being in contact with and grounded to the metal plate, and a second portion connected to the first portion, and positioned at a side end of the side cover; and a frame configured to retain the plurality of display modules in the two-dimensional matrix.

A conductivity of the side end member may be greater than a conductivity of the side cover.

Also, an end of the first portion in a direction in which the mounting surface faces may be spaced at a distance from a front end of the front cover in the direction in which the mounting surface faces.

Also, the end of the first portion in the direction in which the mounting surface faces may be positioned behind a light-emitting surface of the plurality of inorganic light-emitting devices in the direction in which the mounting surface faces.

According to a concept of the disclosure, a display module includes: a substrate including a mounting surface on which a plurality of inorganic light-emitting devices are mounted, a side surface, and a rear surface being opposite to the mounting surface; a metal plate bonded with the rear surface; a side cover covering the side surface; and a side end member covering at least one portion of a side end of the side cover, the side end member (i) being formed of a material having higher conductivity than the side cover grounded to the metal plate, and (ii) extending from at least one portion of the metal plate to at least one portion of the side cover in a direction in which the mounting surface faces.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
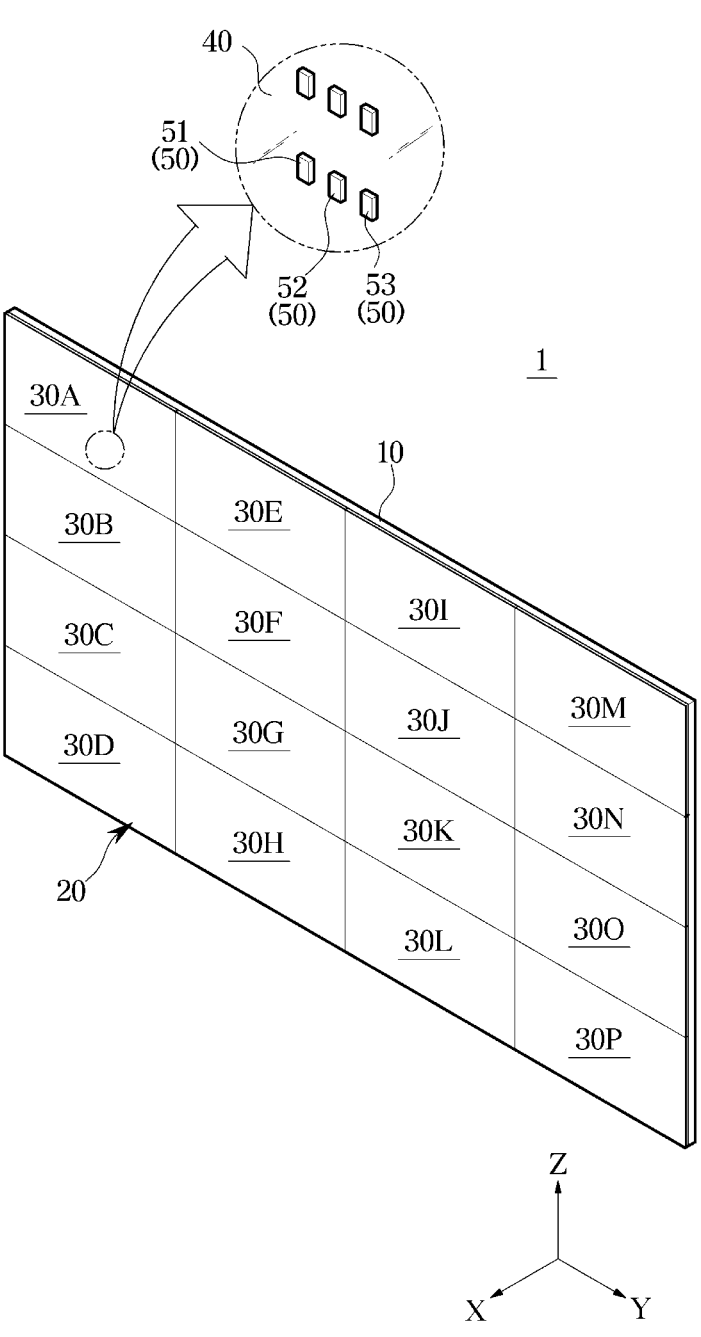
FIG. 1 shows a display apparatus according to an embodiment of the disclosure.

The embodiments described in the present specification are only the preferred embodiments of the disclosure, and thus it is to be understood that various equivalents and modified examples, which may replace the embodiments, are possible when filing the present application.

It is to be understood that the singular forms "a," "an," and "the" include plural referents unless the context clearly dictates otherwise. In the drawings, for easy understanding, the shapes or sizes of components are more or less exaggeratedly shown.

It will be understood that when the terms "includes," "comprises," "including," and/or "comprising," when used in this specification, specify the presence of stated features, figures, steps, operations, components, members, or combinations thereof, but do not preclude the presence or addition of one or more other features, figures, steps, operations, components, members, or combinations thereof.

Also, in this specification, the meaning of 'identical' may include similar in attribute or similar within a certain range. Also, the term 'identical' means 'substantially identical'. The meaning of 'substantially identical' needs to be understood that a value falling within the margin of error in manufacturing or a value corresponding to a difference within a meaningless range with respect to a reference value is included in the range of 'identical'.

Throughout the disclosure, the expression "at least one of a, b or c" indicates only a, only b, only c, both a and b, both a and c, both b and c, all of a, b, and c, or variations thereof.

Hereinafter, preferred embodiments of the disclosure will be described in detail with reference to the accompanying drawings.

Figure 2:
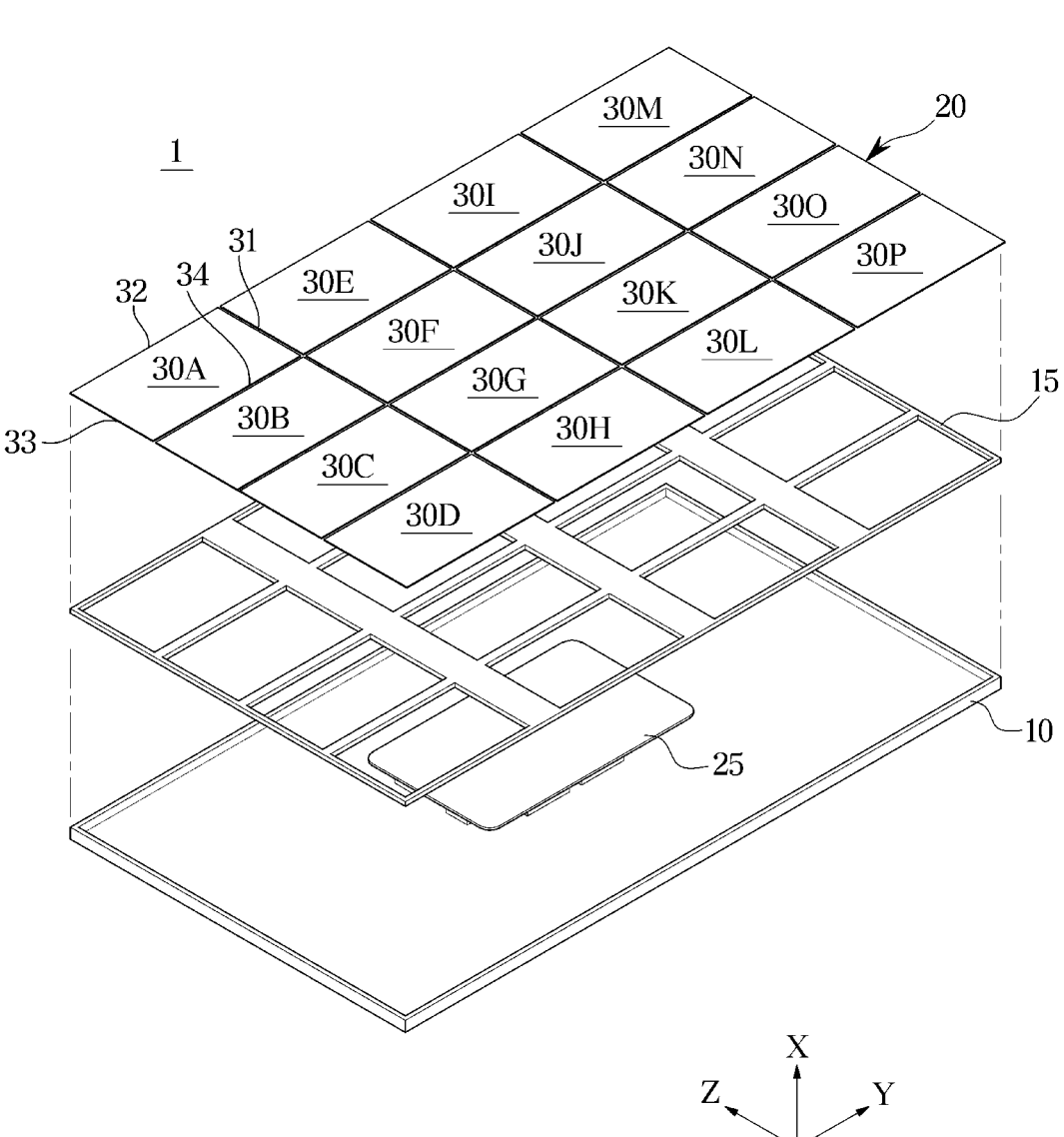
FIG. 2 is an exploded view showing main components of the display apparatus of FIG. 1.
Figure 3:
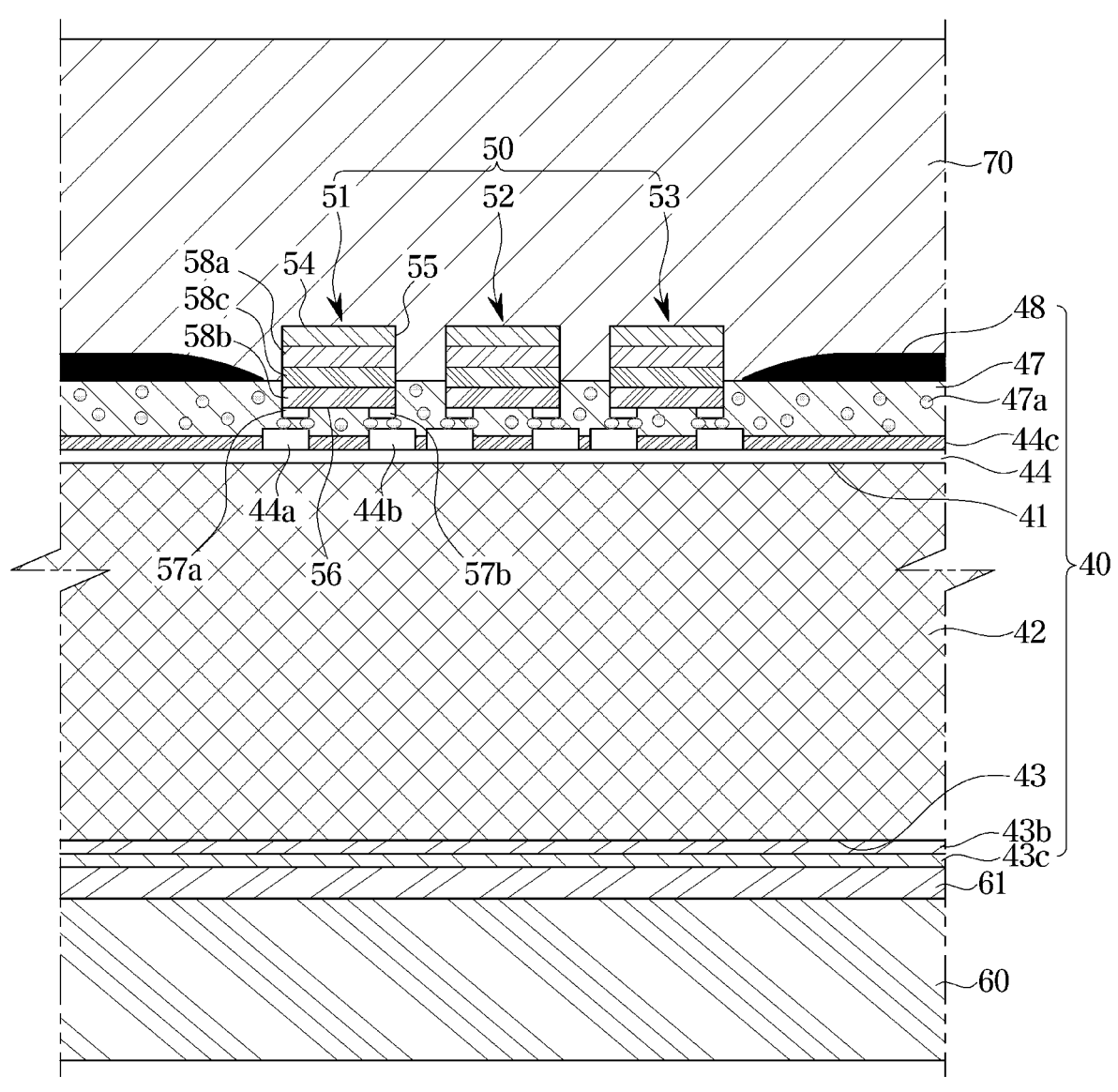
FIG. 3 is an enlarged cross-sectional view showing some components of a display module shown in FIG. 1.
Figure 4:
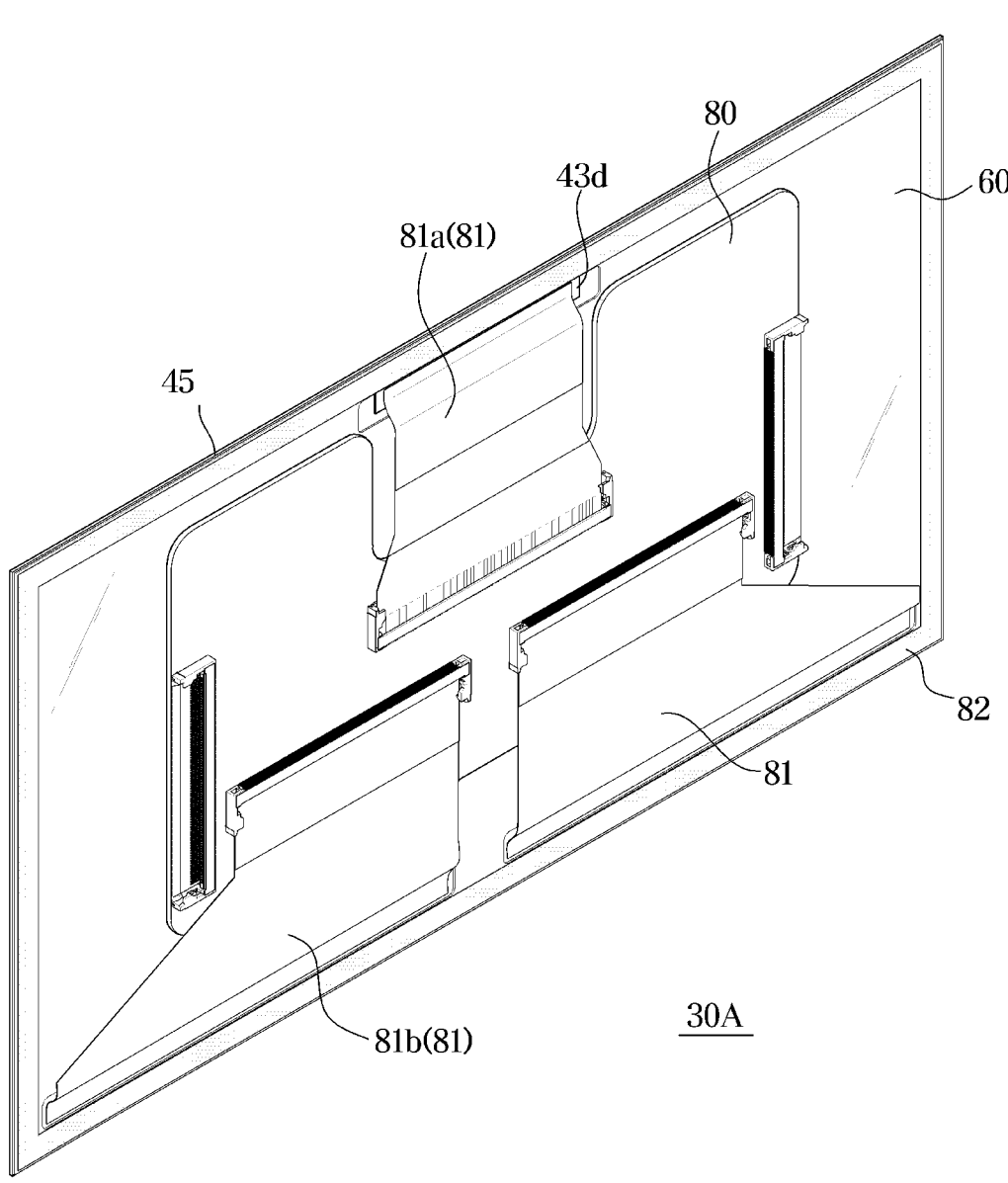
FIG. 4 is a rear perspective view of a display module of the display apparatus shown in FIG. 1.
Figure 5:
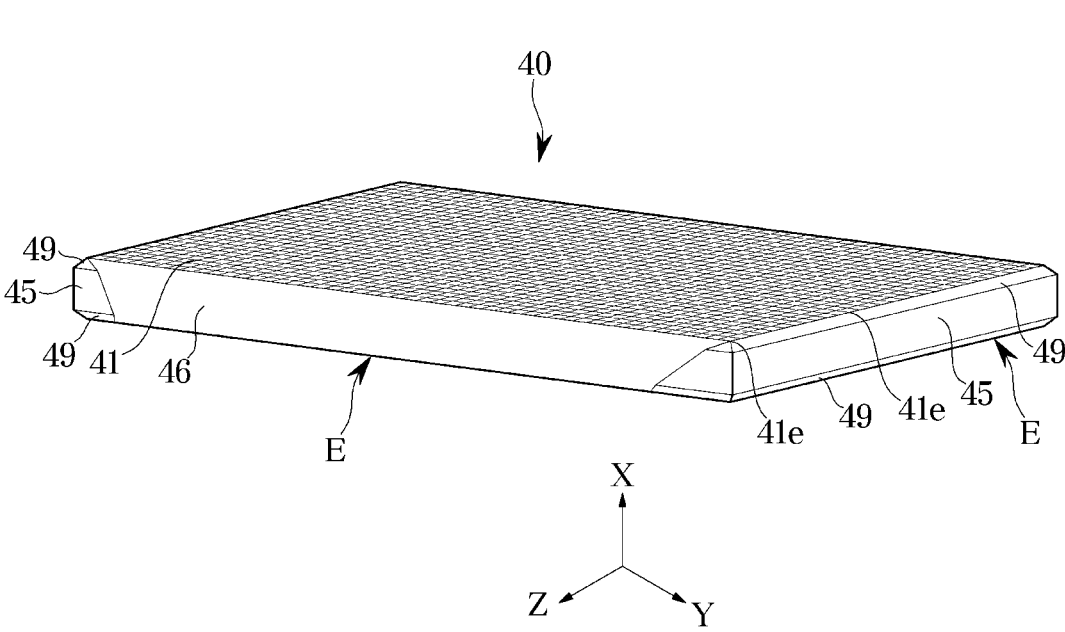
FIG. 5 is a perspective view of some components of a display module shown in FIG. 1.

FIG. 1 shows a display apparatus according to an embodiment, FIG. 2 is an exploded view showing main components of the display apparatus of FIG. 1, FIG. 3 is an enlarged cross-sectional view showing some components of a display module shown in FIG. 1, FIG. 4 is a rear perspective view of a display module of the display apparatus shown in FIG. 1, and FIG. 5 is a perspective view of some components of a display module shown in FIG. 1.

Some components of a display apparatus 1, including a plurality of inorganic light-emitting devices 50, shown in the drawings may be micro-scale components each having a size of several micrometers (μm) to hundreds of micrometers (μm), and for convenience of description, some components (e.g., the plurality of inorganic light emitting devices 50, and a black matrix 48) are exaggerated in scale.

The display apparatus 1 may be an apparatus for displaying information and data as characters, figures, graphs, images, and/or any other visual representations. The display apparatus 1 may be, for example, a television (TV), a personal computer (PC), a mobile device, a digital signage, and other electronic displays.

According to an embodiment of the disclosure, as shown in FIGS. 1 and 2, the display apparatus 1 may include a display panel 20 for displaying an image, a power supply device (not shown) for supplying power to the display panel 20, a main board 25 for controlling overall operations of the display panel 20, a frame 21 supporting the display panel 20, and a rear cover 10 covering a rear surface of the frame 21.

The display panel 20 may include a plurality of display modules 30A to 30P, a driving board (not shown) for driving the individual display modules 30A to 30P, and a timing controller (TOCN) board for generating timing signals for respectively controlling the display modules 30A to 30P.

The rear cover 10 may support the display panel 20. The rear cover 10 may be installed on a floor through a stand (not shown), mounted on a wall through a hanger (not shown), or fixated by any other suitable structural support.

The plurality of display modules 30A to 30P may be arranged within the Z-Y plane to be adjacent to each other. The plurality of display modules 30A to 30P may be arranged in a form of a M*N matrix. In the current embodiment of the disclosure, 16 display modules 30A to 30P may be arranged in a form of a 4*4 matrix. However, a number and arrangement of the plurality of display modules 30A to 30P are not limited.

The plurality of display modules 30A to 30P may be mounted on the frame 21. The plurality of display modules 30A to 30P may be mounted on the frame 21 by various known methods, such as a magnetic force generated by a magnet or a mechanical insert structure. A rear side of the frame 21 may be coupled with the rear cover 10, and the rear cover 10 may form a rear outer appearance of the display apparatus 1.

The rear cover 10 may include a metal material. Accordingly, heat generated from the plurality of display modules 30A to 30P and the frame 21 may be easily transferred to the rear cover 10, which raises heat dissipation efficiency of the display apparatus 1.

As such, the display apparatus 1 may implement a large screen by tiling the plurality of display modules 30A to 30P.

In some arrangements, each of the plurality of display modules 30A to 30P may be applied to a display apparatus. That is, the display modules 30A to 30P may be, in unit of a piece, installed in and applied to a wearable device, a portable device, a handheld device, various electronic products, or electronic parts configured to incorporate a display. Also, the display modules 30A to 30P may be applied to a display apparatus, such as a monitor for PC, a high-resolution TV, a signage, or an electronic display, by being assembled and arranged in a matrix type.

The plurality of display modules 30A to 30P may have the same configuration. Accordingly, the following description about a display module may be applied in the same way to all the other display modules.

Hereinafter, a first display module 30A of the plurality of display modules 30A to 30P will be described because the plurality of display modules 30A to 30P have the same configuration.

That is, to avoid duplicate descriptions, as components of the plurality of display modules 30A to 30P, a display module 30, a substrate 40, and a front cover 70 will be representatively described.

Also, the first display module 30A of the plurality of display modules 30A to 30P and a second display module 30E being adjacent to the first display module 30A in a second direction Y or a third display module 30B being adjacent to the first display module 30A in a third direction Z will be described as necessary.

The first display module 30A of the plurality of display modules 30A to 30P may be formed, for example, in a quadrangle type. The first display module 30A may be formed in a rectangle type or a square type.

Accordingly, the first display module 30A may include edges 31, 32, 33, and 34 located in upper, lower, left, and right directions with respect to a first direction X which is a front direction.

As shown in FIG. 3, each of the plurality of display modules 30A to 30P may include the substrate 40, and the plurality of inorganic light-emitting devices 50 mounted on the substrate 40. The plurality of inorganic light-emitting devices 50 may be mounted on a mounting surface 41 of the substrate 40 toward the first direction X. In FIG. 3, for convenience of description, a thickness in first direction X of the substrate 400 is shown to be exaggeratedly great.

The substrate 40 may be formed in a quadrangle type. As described above, because each of the plurality of display modules 30A to 30P is formed in a quadrangle type, the substrate 40 may also be formed in a quadrangle type correspondingly.

The substrate 40 may be formed in a quadrangle type or a square type.

Accordingly, in the example of the first display module 30A, the substrate 40 may include four edges E corresponding to the edges 31, 32, 33, and 34 of the first display module 30A, formed in the upper, lower, left, and right directions with respect to the first direction X which is the front direction (see FIG. 5).

The substrate 40 may include a substrate body 42, the mounting surface 41 forming one surface of the substrate body 42, a rear surface 43 forming the other surface of the substrate body 42 and being opposite to the mounting surface 41, and a side surface 45 positioned between the mounting surface 41 and the rear surface 43.

The side surface 45 may form side ends of the substrate 40 in the second direction Y and the third direction Z that are orthogonal to the first direction X.

The substrate 40 may include a chamfer portion 49 formed between the mounting surface 41 and the side surface 45 and between the rear surface 43 and the side surface 45.

The chamfer portion 49 may prevent, upon an arrangement of the plurality of display modules 30A to 30P, each substrate from colliding with each other and being damaged.

The edges E of the substrate 40 may include the side surface 45 and the chamfer portion 49.

The substrate 40 may include a thin film transistor (TFT) layer 44 formed on the substrate body 42 to drive the inorganic light-emitting devices 50. The substrate body 42 may include a glass substrate. That is, the substrate 40 may include a chip on glass (COG) type substrate. On the substrate 40, a first pad electrode 44a and a second pad electrode 44b may be formed to electrically connect the inorganic light-emitting devices 50 to the TFT layer 44.

TFTs configuring the TFT layer 44 are not limited to specific structures or types, and may be implemented as various or types. That is, TFTs of the TFT layer 44 according to an embodiment of the disclosure may be implemented as low temperature polycrystaline silicon (LTPS) TFTs, oxide TFTs, Si (polycrystalline silicon or amorphous silicon) TFTs, organic TFTs, or graphene TFTs.

Also, the TFT layer 44 may be replaced with a complementary metal-oxide semiconductor (CMOS) type, n-type metal-oxide-semiconductor field-effect transistor (MOS-FET), or p-type MOSFET, in a case in which the substrate body 42 of the substrate 40 is a silicon wafer.

The plurality of inorganic light-emitting devices 50 may be formed of an inorganic material, and each of the inorganic light-emitting devices 50 may have sizes of several micrometers (μm) to hundreds of micrometers (μm) in width, length, and height. A micro inorganic light-emitting device may have a shorter side length of 100 μm or less. That is, the inorganic light-emitting devices 50 may be picked up from a sapphire or silicon wafer and then directly transferred onto the substrate 40. The plurality of inorganic light-emitting devices 50 may be picked up and conveyed through an electrostatic method using an electrostatic head or a stamp method using an elastic polymer material, such as polydimethylsiloxane (PDMS) or silicon, as a head.

The plurality of inorganic light-emitting devices 50 may be a light-emitting structure including an n-type semiconductor 58*a*, an active layer 58*c*, a p-type semiconductor 58*b*, a first contact electrode 57*a*, and a second contact electrode 57*b*.

Although not shown in the drawings, any one of the first contact electrode 57*a* and the second contact electrode 57*b* may be electrically connected to the n-type semiconductor 58*a*, and the other one may be electrically connected to the p-type semiconductor 58*b*.

The first contact electrode 57*a* and the second contact electrode 57*b* may be a flip chip type arranged horizontally toward the same direction (an opposite direction of a light-emitting direction).

Each inorganic light-emitting device 50 may include a light-emitting surface 54 positioned toward the first direction X upon being mounted on the mounting surface 41, a side surface 55, and a bottom surface 56 being opposite to the light-emitting surface 54, and the first contact electrode 57*a* and the second contact electrode 57*b* may be formed on the bottom surface 56.

That is, the first and second contact electrodes 57*a* and 57*b* of the inorganic light-emitting device 50 may be opposite to the light-emitting surface 54, and accordingly, the first and second contact electrodes 57*a* and 57*b* may be positioned in the opposite direction of the light-emitting direction.

The first and second contact electrodes 57*a* and 57*b* may face the mounting surface 41, and be electrically connected to the TFT layer 44. Also, the light-emitting surface 54 through which light is irradiated may be positioned in an opposite direction of the direction in which the first and second contact electrodes 57*a* and 57*b* are positioned.

Accordingly, light generated by the active layer 58*c* may be irradiated toward the first direction X through the light-emitting surface 54, without any interference by the first and second contact electrodes 57*a* and 57*b*.

That is, the first direction X may be defined as a direction in which the light-emitting surface 54 is positioned to irradiate light.

The first contact electrode 57*a* and the second contact electrode 57*b* may be electrically connected respectively to the first pad electrode 44*a* and the second pad electrode 44*b* formed on the mounting surface 41 of the substrate 40.

The inorganic light-emitting device 50 may be connected directly to the first and second pad electrodes 44*a* and 44*b* through an anisotropic conductive layer 47 or a bonding material such as a solder.

On the substrate 40, the anisotropic conductive layer 47 may be formed to mediate an electrical connection between the first and second contact electrodes 57*a* and 57*b* and the first and second pad electrodes 44*a* and 44*b*. The anisotropic conductive layer 47 may be formed by applying an anisotropic conductive adhesive on a protective film, and have a structure in which conductive balls 47*a* is distributed in an adhesive resin. Each conductive ball 47*a* may be a conductive sphere surrounded by a thin insulating film, and as a result of breaking of the insulating film by pressure, the conductive ball 47 may electrically connect a conductor to another one.

The anisotropic conductive layer 47 may include an anisotropic conductive film (ACF) being in a form of a film, and an anisotropic conductive paste (ACP) being in a form of a paste.

In an embodiment of the disclosure, the anisotropic conductive layer 47 may be provided as an anisotropic conductive film.

Accordingly, the insulating films of the conductive balls 47*a* may be broken by pressure applied to the anisotropic conductive layer 47 upon mounting of the plurality of inorganic light-emitting devices 50 on the substrate 40, and as a result, the first and second contact electrodes 57*a* and 57*b* of the inorganic light-emitting devices 50 may be electrically connected to the first and second pad electrodes 44*a* and 44*b* of the substrate 40.

Although not shown in the drawings, the plurality of inorganic light-emitting devices 50 may be mounted on the substrate 40 through a solder (not shown), instead of the anisotropic conductive layer 47. By performing a reflow process after arranging the inorganic light-emitting devices 50 on the substrate 40, the inorganic light-emitting devices 50 may be bonded on the substrate 40.

The plurality of inorganic light-emitting devices 50 may include a red light-emitting device 51, a green light-emitting device 52, and a blue light-emitting device 53. The inorganic light-emitting devices 50 may be mounted in unit of a group including the red light-emitting device 51, the green light-emitting device 52, and the blue light-emitting device 53 on the mounting surface 41 of the substrate 40. The red light-emitting device 51, the green light-emitting device 52, and the blue light-emitting device 53 may form a pixel. In this case, each of the red light-emitting device 51, the green light-emitting device 52, and the blue light-emitting device 53 may form a sub pixel.

The red light-emitting device 51, the green light-emitting device 52, and the blue light-emitting device 53 may be aligned with preset intervals, as in the current embodiment of the disclosure. However, the red light-emitting device 51, the green light-emitting device 52, and the blue light-emitting device 53 may be arranged in another form such as a triangle.

The substrate 40 may include a light absorbing layer 44*c* for absorbing external light to improve display contrast. The light absorbing layer 44*c* may be formed on the entire of the mounting surface 41 of the substrate 40. The light absorbing layer 44*c* may be formed between the TFT layer 44 and the anisotropic conductive layer 47.

The plurality of display modules 30A to 30P may further include the black matrix 48 formed between the plurality of inorganic light-emitting devices 50.

The black matrix 48 may function to supplement the light absorbing layer 44*c* formed on the entire of the mounting surface 41 of the substrate 40. That is, the black matrix 48 may improve contrast of a screen by absorbing external light such that the substrate 40 is shown to be black.

The black matrix 48 may have, preferably, a black color.

According to the current embodiment of the disclosure, the black matrix 48 may be positioned between pixels each formed by the red light-emitting device 51, the green light-emitting device 52, and the blue light-emitting device 53. However, unlike the current embodiment of the disclosure, the black matrix 48 may be formed more finely to partition the red light-emitting device 51, the green light-emitting device 52, and the blue light-emitting device 53 which are sub pixels.

The black matrix 48 may be formed in a shape of a lattice having a horizontal pattern and a vertical pattern to be positioned between the pixels.

The black matrix 48 may be formed by applying a light absorbing ink on the anisotropic conductive layer 47 through an ink-jet process and then hardening the light absorbing ink or by coating the anisotropic conductive layer 47 with a light absorbing film.

That is, the black matrix 48 may be formed in areas between the plurality of inorganic light-emitting devices 50, in which none of the plurality of inorganic light-emitting devices 50 is mounted, on the anisotropic conductive layer 47 formed on the entire of the mounting surface 41.

Each of the plurality of display modules 30A to 30P may include a front cover 70 positioned in the front direction X on the mounting surface 41 of the display module 30A to 30P to cover the mounting surface 41.

Figure 6:
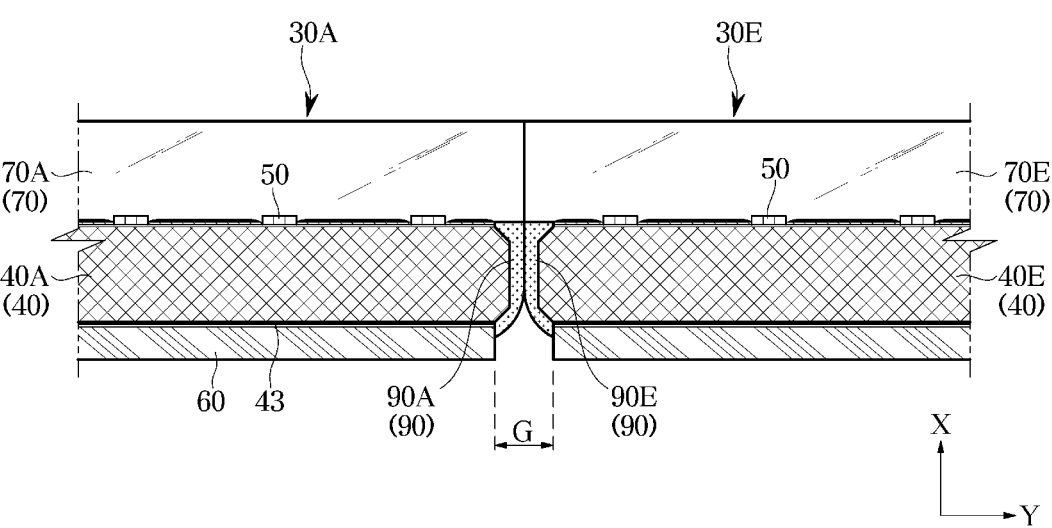
FIG. 6 is a cross-sectional view of some components of the display apparatus shown in FIG. 1, taken along a second direction.
Figure 7:
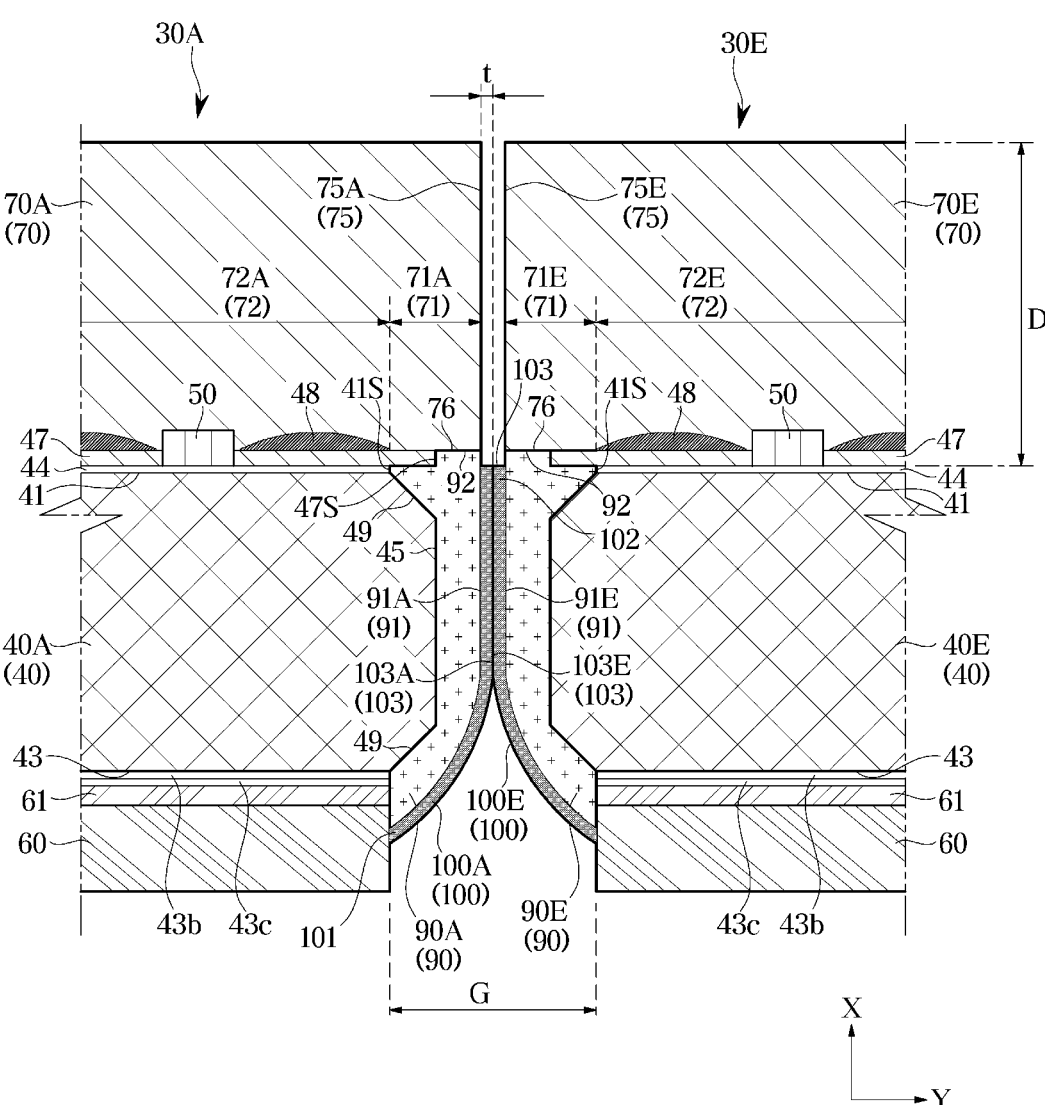
FIG. 7 is an enlarged cross-sectional view of the some components shown in FIG. 6.

A plurality of front covers 70 may be respectively formed in the first direction X on the plurality of display modules 30A to 30P (see FIGS. 6 and 7).

The plurality of display modules 30A to 30P may be assembled with each other after the front covers 70 are respectively formed on the display modules 30A to 30P. That is, in an example of the first display module 30A and the second display module 30E among the plurality of display modules 30A to 30P, a first front cover 70A may be formed on the mounting surface 41 of the first display module 30A and a second front cover 70E may be formed on the mounting surface 41 of the second display module 30E.

The front cover 70 may cover the substrate 40 to protect the substrate 40 against an external force or outside water.

A plurality of layers (not shown) of the front cover 70 may be provided as a functional film having optical performance. The plurality of layers will be described in detail, later.

Some of the plurality of layers of the front cover 70 may include a base layer (not shown) formed of an optical clear resin (OCR). The base layer (not shown) may support the other layers (not shown). The OCR may be in a very transparent state because the OCR may have transmittance of 90% or more.

The OCR may improve visibility and image quality by raising transmittance through a low reflection property. That is, in a structure having an air gap, light loss occurs due to a refractive index difference between a film layer and an air layer. However, in a structure having an OCR, such a refractive index difference may be reduced to decrease light loss, resulting in an improvement of visibility and image quality.

That is, the OCR may improve image quality, in addition to protecting the substrate 40.

Some of the plurality of layers (not shown) of the front cover 70 may include an adhesive layer (not shown) for bonding the front cover 70 with the mounting surface 41 of the substrate 40.

The front cover 70 may have a height that is greater than or equal to a preset height in the first direction X in which the mounting surface 41 or the light-emitting surface 54 faces.

The front cover 70 formed on the substrate 40 may have a height capable of sufficiently filling a gap that may be formed between the plurality of inorganic light-emitting devices 50 with respect to the front cover 70.

Also, each of the plurality of display modules 30A to 30P may include a rear adhesive tape 61 positioned between the rear surface 43 of the substrate 40 and a metal plate 60 to bond the rear surface 43 with the metal plate 60.

The rear adhesive tape 61 may be a double-sided adhesive tape. However, the rear adhesive tape 61 is not limited to a double-sided adhesive tape, and may be an adhesive layer, not a tape. That is, the rear adhesive tape 61 may be an embodiment of a medium for bonding the metal plate 60 with the rear surface 43 of the substrate 40, and the rear adhesive tape 61 may be provided as one of various mediums, without being limited to a tape.

The plurality of inorganic light-emitting devices 50 may be electrically connected to a pixel driving wiring (not shown) formed on the mounting surface 41, and an upper wiring layer (not shown) extending through the side surface 45 of the substrate 40 and formed with a pixel driving wiring (not shown).

The upper wiring layer (not shown) may be formed below the anisotropic conductive layer 47. The upper wiring layer (not shown) may be electrically connected to a side wiring 46 formed on the side surface 45 of the substrate 40. The side wiring 46 may be provided in a form of a thin film. The side wiring 46 may include a side wiring coating 46b surrounding the side wiring 46 to prevent the side wiring 46 from being exposed to outside and damaged (see FIG. 9).

Under an assumption that the second direction Y is a left-right direction of the display apparatus 1, being orthogonal to the first direction X toward the front direction of the display apparatus 1, and the third direction Z is an up-down direction of the display apparatus 1, being orthogonal to the first direction X and the second direction Y, the side wiring 46 may extend to the rear surface 43 of the substrate 40 in the third direction Z along the chamfer portion 49 and the side surface 45 of the substrate 40 extending in the third direction Z, although other arrangements may be used.

However, the side wiring 46 may extend to the rear surface 43 of the substrate 40 in the second direction Y along the chamfer portion 46 and the side surface 45 of the substrate 40 extending in the second direction Y.

In some arrangements, the side wiring 46 may extend along the edges E of the substrate 40, corresponding to the upper edge 32 and the lower edge 34 of the first display module 30A, although all arrangements are not limited thereto.

For example, the side wiring 46 may extend along the edges E of the substrate 40, corresponding to at least two edges of the four edges 31, 32, 33, and 34 of the first display module 30A.

The upper wiring layer (not shown) may be connected to the side wiring 46 by an upper connecting pad (not shown) formed on the edges E of the substrate 40.

The side wiring 46 may extend along the side surface 45 of the substrate 40 and be connected to a rear wiring layer 43b formed on the rear surface 43.

An insulating layer 43c may be formed on the rear wiring layer 43b in a direction which the rear surface 43 of the substrate 40 faces, to cover the rear wiring layer 43b.

That is, the plurality of inorganic light-emitting devices 50 may be electrically connected to the upper wiring layer (not shown), the side wiring 46, and the rear wiring layer 43b, sequentially.

Also, as shown in FIG. 4, the first display module 30A may include a driving circuit board 80 for electrically controlling the plurality of inorganic light-emitting devices 50 mounted on the mounting surface 41. The driving circuit board 80 may be a printed circuit board. The driving circuit board 80 may be positioned on the rear surface 43 of the substrate 40 in the first direction X. The driving circuit board 80 may be positioned on the metal plate 60 bonded on the rear surface 43 of the substrate 40.

The first display module 30A may include a flexible film 81 connecting the driving circuit board 80 to the rear wiring layer 43b to electrically connect the driving circuit board 80 to the plurality of inorganic light-emitting devices 50.

More specifically, one end of the flexible film 81 may be connected to a rear connecting pad 43d positioned on the rear surface 43 of the substrate 40 and electrically connected to the plurality of inorganic light-emitting devices 50.

The rear connecting pad 43d may be electrically connected to the rear wiring layer 43b. Accordingly, the rear connecting pad 43d may electrically connect the rear wiring layer 43b to the flexible film 81.

Because the flexible film 81 is electrically connected to the rear connecting pad 43d, the flexible film 81 may transfer power and an electrical signal from the driving circuit board 80 to the plurality of inorganic light-emitting devices 50.

The flexible film 81 may be a flexible flat cable (FFC) or a chip on film (COF).

The flexible film 81 may include a first flexible film 81a and a second flexible film 81b respectively positioned in upper and lower directions with respect to the first direction X which is the front direction, although not limited thereto.

However, the first flexible film 81a and the second flexible film 81b may be positioned in left and right directions with respect to the first direction X, or the first flexible film 81a and the second flexible film 81b may be positioned in at least two directions of the upper, lower, left, and right directions.

A plurality of second flexible films 81b may be provided, although not limited thereto. However, a single second flexible film 81b may be provided, and a plurality of first flexible films 81a may also be provided.

The first flexible film 81a may transfer a data signal from the driving circuit board 80 to the substrate 40. The first flexible film 81a may be a COF, although not limited thereto.

The second flexible film 81b may transfer power from the driving circuit board 80 to the substrate 40. The second flexible film 81b may be a FFC, although not limited thereto.

In some arrangements, the first flexible film 81a and the second flexible film 81b may be a COF and a FFC, respectively.

The driving circuit board 80 may be electrically connected to the main board 25 (see FIG. 2), although not shown in the drawings. The main board 25 may be positioned behind a frame 15, and the main board 25 may be connected to the driving circuit board 80 through a cable (not shown) behind the frame 15.

As described above, the metal plate 60 may be in contact with the substrate 40. The metal plate 60 may be bonded to the substrate 40 by the rear adhesive tape 61 positioned between the rear surface 43 of the substrate 40 and the metal plate 60.

The metal plate 60 may be formed of a metal material having high heat conductivity. For example, the metal plate 60 may be formed of an aluminum material.

Heat generated by the TFT layer 44 and the plurality of inorganic light-emitting devices 50 mounted on the substrate 40 may be transferred to the metal plate 60 through the rear adhesive tape 61 along the rear surface 43 of the substrate 40.

Accordingly, heat generated by the substrate 40 may be easily transferred to the metal plate 60, and temperature of the substrate 40 may be prevented from rising to certain temperature or higher.

The plurality of display modules 30A to 30P may be arranged at various locations in a form of a M*N matrix. The display modules 30A to 30P may be independently movable. In this case, because each of the display modules 30A to 30P includes the metal plate 60, a constant level of heat dissipation performance may be maintained regardless of the locations of the display modules 30A to 30P.

The display apparatus 1 may form screens having various sizes by arranging the display modules 30A to 30P in various forms of M*N matrixes. Therefore, by including the metal plate 60 in each of the display modules 30A to 30P to cause each of the display modules 30A to 30P to dissipate heat independently, according to an embodiment of the disclosure, instead of dissipating heat through a single metal plate for heat dissipation, total heat dissipation performance of the display apparatus 1 may be improved.

In a case in which a single metal plate is positioned inside the display apparatus 1, the metal plate may be not positioned at locations corresponding to some display modules with respect to a front-rear direction, while being positioned at locations where no display modules are positioned, which lowers heat dissipation efficiency of the display apparatus 1.

That is, by arranging the metal plate 60 in each of the display modules 30A to 30P to cause each of the display modules 30A to 30P to dissipate heat at any location through the metal plate 60, the total heat dissipation performance of the display apparatus 1 may be improved.

The metal plate 60 may be provided in a shape of a rectangle substantially corresponding to a shape of the substrate 40.

An area of the substrate 40 may be at least equal to or larger than an area of the metal plate 60. Upon a parallel arrangement of the substrate 40 and the metal plate 60 in the first direction X, the four edges E of the substrate 40 being in the shape of the rectangle may be positioned in correspondence to four edges of the metal plate 60 with respect to a center of the substrate 40 and the metal plate 60, or the four edges E of the substrate 40 may be positioned at outer locations than the four edges of the metal plate 60 with respect to the center of the substrate 40 and the metal plate 60.

Preferably, the four edges E of the substrate 40 may be positioned at the outer locations than the four edges of the metal plate 60. That is, the area of the substrate 40 may be larger than the area of the metal plate 60.

Upon transferring of heat to the display modules 30A to 30P, the substrate 40 and the metal plate 60 may be heat-expanded. Because the metal plate 60 has a greater coefficient of thermal expansion than the substrate 40, a degree of expansion of the metal plate 60 may be greater than a degree of expansion of the substrate 40.

In a case in which the four edges of the substrate 40 correspond to the four edges of the metal plate 60 or are positioned at inner locations than the four edges of the substrate 40, the edges of the metal plate 60 may protrude to outside of the substrate 40.

Accordingly, spacing distances of gaps formed between the display modules 30A to 30P may become irregular due to heat-expansion of the metal plate 60 of each of the display modules 30A to 30P, and visibility of some seams may rise, resulting in deterioration in sense of unity of a screen of the display panel 20.

However, by positioning the four edges E of the substrate 40 at the outer locations than the four edges of the metal plate 60, the metal plate 60 may not protrude to the outside of the four edges E of the substrate 40 although the substrate 40 and the metal plate 60 are heat-expanded, and accordingly, the gaps formed between the display modules 30A to 30P may be maintained with regular spacing distances.

Additionally, to maintain regular spacing distances of the gaps formed between the display modules 30A to 30P, the frame 15 supporting the display modules 30A to 30P may include a front surface having a material property that is similar to a material property of the substrate 40. That is, the display modules 30A to 30P may be bonded on the front surface of the frame 15.

In some arrangements, the area of the substrate 40 may substantially correspond to the area of the metal plate 60. Accordingly, heat generated from the substrate 40 may be uniformly dissipated over the entire area of the substrate 40 without being isolated in some areas.

The metal plate 60 may be bonded on the rear surface 43 of the substrate 40 by the rear adhesive tape 61.

The rear adhesive tape 61 may have a size corresponding to the metal plate 60. That is, an area of the rear adhesive tape 61 may correspond to the area of the metal plate 60. The metal plate 60 may be substantially in a shape of a rectangle, and the rear adhesive tape 61 may also be in a shape of a rectangle correspondingly.

The edges of the metal plate 60 being in the shape of the rectangle may correspond to the edges of the rear adhesive tape 61 being in the shape of the rectangle with respect to a center of the metal plate 60 and the rear adhesive tape 61.

Accordingly, the metal plate 60 and the rear adhesive tape 61 may be easily manufactured as a coupled configuration, thereby increasing manufacturing efficiency of the display apparatus 1.

That is, before a plate is cut into unit pieces to form the metal plate 60, the rear adhesive tape 61 may be bonded on the plate and then the rear adhesive tape 61 and the plate may be cut together into unit pieces to form the metal plate 60, thereby reducing a number of processes.

Heat generated from the substrate 40 may be transferred to the metal plate 60 through the rear adhesive tape 61. Accordingly, the rear adhesive tape 61 may bond the metal plate 60 on the substrate 40, while transferring heat generated from the substrate 40 to the metal plate 60.

Accordingly, the rear adhesive tape 61 may include a material having high heat dissipation performance.

The rear adhesive tape 61 may include, basically, a material having an adhesive property to bond the substrate 40 with the metal plate 60.

Additionally, the rear adhesive tape 61 may include a material having high heat dissipation performance rather than materials having an adhesive property. Accordingly, the rear adhesive tape 61 may efficiently transfer heat between the substrate 40 and the metal plate 60.

Also, the material having the adhesive property, included in the rear adhesive tape 61, may be a material having higher heat dissipation performance than an adhesive material constituting an existing adhesive.

The material having the higher heat dissipation performance may be a material capable of effectively transferring heat because the material has high heat conductivity, high heat transfer performance, and low specific heat.

For example, the rear adhesive tape 61 may include a graphite material, although not limited thereto. However, the rear adhesive tape 61 may be formed of any material having high heat dissipation performance.

Flexibility of the rear adhesive tape 61 may be greater than flexibility of the substrate 40 and the metal plate 60. Accordingly, the rear adhesive tape 61 may be formed of a material having an adhesive property, heat dissipation, and high flexibility. The rear adhesive tape 61 may be an inorganic double-sided tape. In this case, the rear adhesive tape 61 may be formed as a single layer of which one side is bonded on the substrate 40 and the other side is bonded on the metal plate 60, without having any medium supporting the one side and the other side.

Because the rear adhesive tape 61 includes no medium, the rear adhesive tape 61 may include no material interfering with heat conduction, and accordingly, heat dissipation performance may increase. However, the rear adhesive tape 61 is not limited to an inorganic double-sided tape, and may be a heat dissipation tape having higher heat dissipation performance than an existing double-sided tape.

The rear adhesive tape 61 may be formed of a material having high flexibility to absorb an external force transferred from the substrate 40 and the metal plate 60. More specifically, flexibility of the rear adhesive tape 61 may be higher than flexibility of the substrate 40 and the metal plate 60.

Accordingly, upon transferring of an external force generated by changed sizes of the substrate 40 and the metal plate 60 by heat transferred to the substrate 40 and the metal plate 60 to the rear adhesive tape 61, the rear adhesive tape 61 may be deformed to prevent the external force from being transferred to the other components.

The rear adhesive tape 61 may have a certain thickness in the first direction X. The metal plate 60 may be heat-expanded by heat or cooled to be contracted. In this case, the metal plate 60 may be expanded or contracted in the first direction X and directions that are orthogonal to the first direction X, and accordingly, an external force may be transferred to the substrate 40.

As described above, because the metal plate 60 is formed with a size corresponding to the substrate 40 and covers the entire of the rear surface 43 of the substrate 40, a fixing member 82 may be positioned on a rear surface of the metal plate 60, although not limited thereto.

However, the fixing member 82 may be positioned on the rear surface 43 of the substrate 40. In this case, the substrate 40 may be bonded directly on the frame 15 through the fixing member 82.

Unlike the embodiment of the disclosure, the metal plate 60 may cover only a portion of the rear surface 43 of the substrate 40, and the fixing member 82 may be bonded on an area not covered by the metal plate 60 in the rear surface 43 of the substrate 40.

The fixing member 82 may be, preferably, a double-sided tape.

Hereinafter, the front cover 70, a side cover 90, and a side end member 100 will be described in detail.

Figure 8:
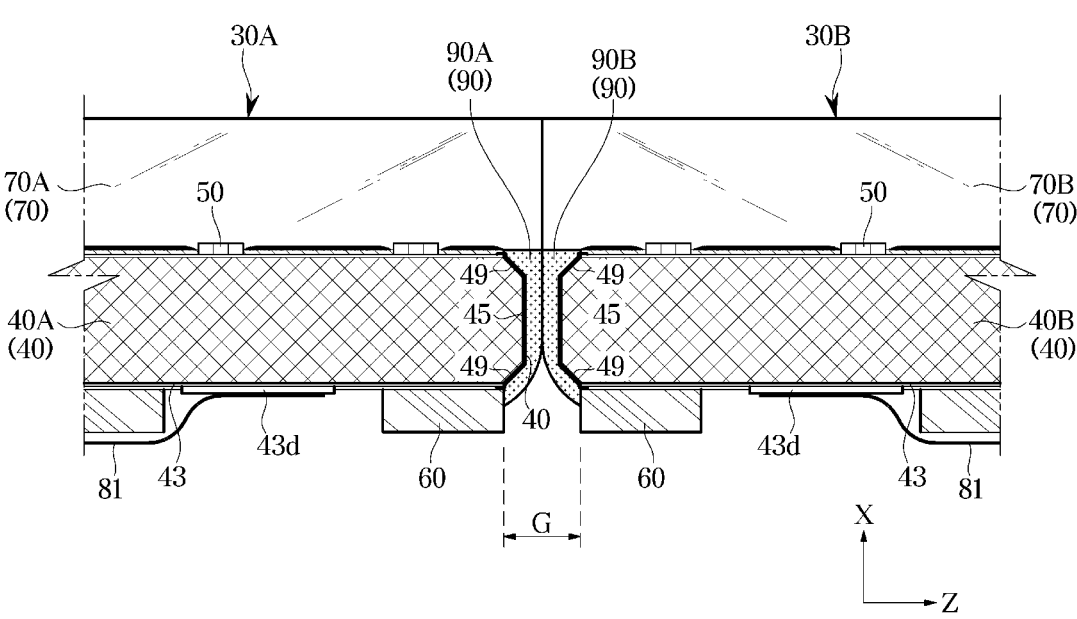
FIG. 8 is a cross-sectional view of some components of the display apparatus shown in FIG. 1, taken along a third direction.
Figure 9:
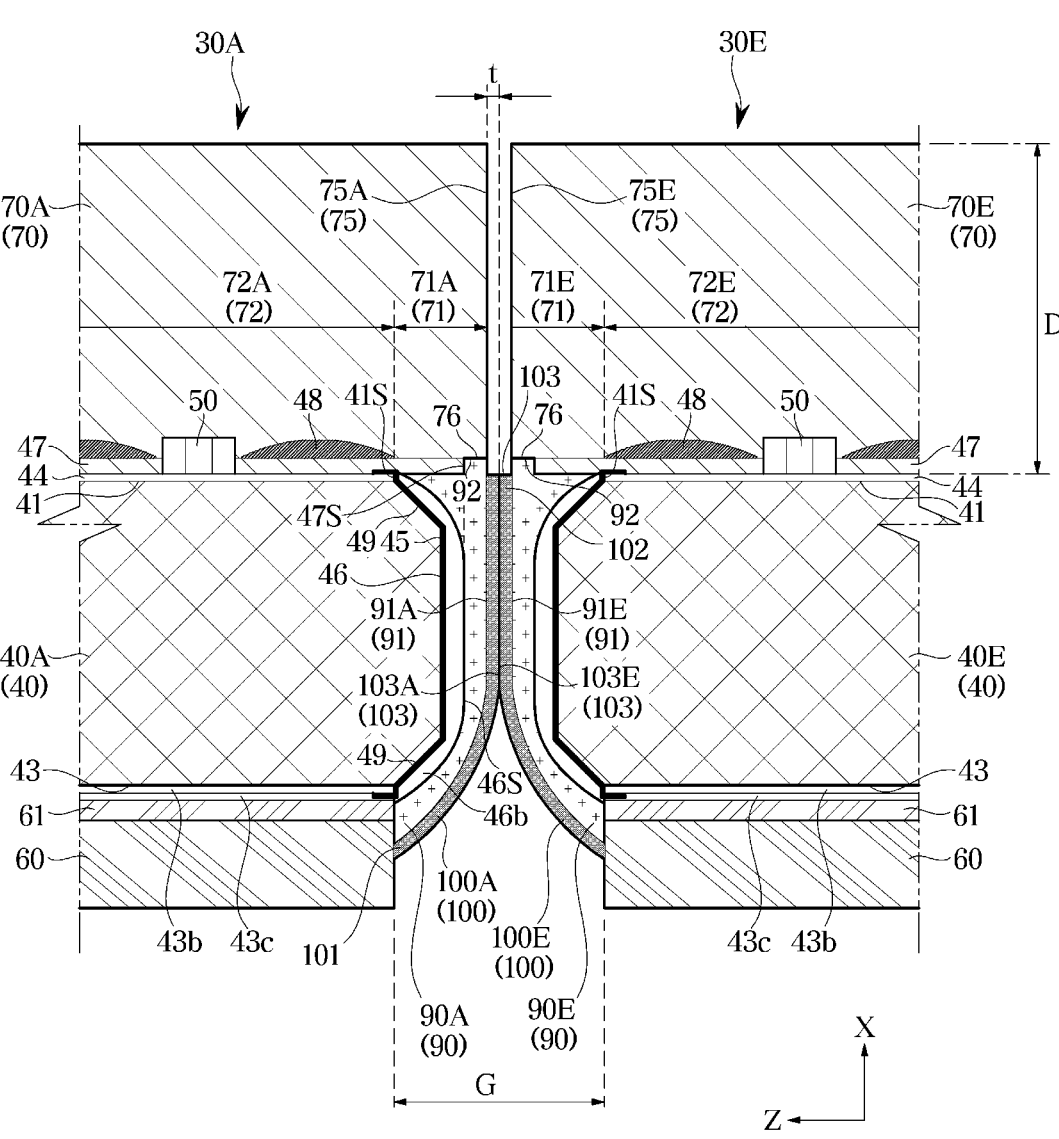
FIG. 9 is an enlarged cross-sectional view of the some components shown in FIG. 8.
Figure 10:
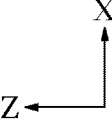
FIG. 10 schematically shows an ESD flow of some components of the display apparatus shown in FIG. 1.

FIG. 6 is a cross-sectional view of some components of the display apparatus shown in FIG. 1, taken along the second direction, FIG. 7 is an enlarged cross-sectional view of the some components shown in FIG. 6, FIG. 8 is a cross-sectional view of some components of the display apparatus shown in FIG. 1, taken along the third direction, FIG. 9 is an enlarged cross-sectional view of the some components shown in FIG. 8, and FIG. 10 schematically shows an ESD flow of some components of the display apparatus of FIG. 1.

The front cover 70 may protect the substrate 40 from an external force, deteriorate visibility of a seam caused by gaps G formed between the plurality of display modules 30A to 30P, and improve color deviation between the plurality of display modules 30A to 30P.

The plurality of display modules 30A to 30P may include the side cover 90 positioned in the gaps G formed between the plurality of display modules 30A to 30P upon an arrangement of the plurality of display modules 30A to 30P.

To absorb light reflected in the gaps G between the plurality of display modules 30A to 30P, the front cover 70 of each of the display modules 30A to 30P may extend to the outside of the substrate 40 of the display module 30A to 30P. A side end 75 of the front cover 70 may extend up to the outside of the mounting surface 41.

More specifically, the front cover 70 may extend up to an outer location than an edge (or referred to as a side end) 41S of the mounting surface 41 of the substrate 40 in the second direction Y and the third direction Z (see FIG. 5).

Substantially, the gaps G between the display modules 30A to 30P may be formed between the side surfaces 45 of the substrates 40 of the display modules 30A to 30P. However, the gaps G according to an embodiment of the disclosure may represent non-display areas that may be generated between the display modules 30A to 30P, and therefore, the gaps G formed between the plurality of display modules 30A to 30P may be spaces formed between the edges 41S of the mounting surfaces 41 of the substrates 40 of neighboring display modules 30A to 30P.

Accordingly, the gaps G formed between the plurality of display modules 30A to 30P may represent spaces formed between the edges 41S of the mounting surfaces 41 of the display modules 30A to 30P being adjacent to each other in the second direction Y or the third direction Z.

The front cover 70 extending from the display modules 30A to 30P may be positioned in the gaps G between the display modules 30A to 30P to absorb light irradiated toward the gaps G or light reflected in the gaps G, thereby reducing visibility of a seam.

Also, the side cover 90 of the display modules 30A to 30P, positioned in the gaps G, may absorb light irradiated toward the gaps G, thereby reducing visibility of a seam, which will be described below.

As shown in FIGS. 6 and 7, the front cover 70 may extend to the outside of the substrate 40 in the second direction Y. More specifically, the front cover 70 may extend up to an outer location than the side surface 45 and the chamfer portion 49 in the second direction Y.

In some arrangements, a description about only an edge of the substrate 40 corresponding to a right edge 31 of the first display module 30A will be given, however, the front cover 70 may extend up to an outer location than the four edges E of the substrate 40 in the second direction Y or the third direction Z.

The side end 75 of the front cover 70, corresponding to an edge of the front cover 70, may extend up to the outside of the substrate 40 farther than the four edges E of the substrate 40, that is, up to the outside of the mounting surface 41, in the second direction Y or the third direction Z.

The front cover 70 may include a plurality of layers having different optical properties, although not shown in the drawings. The plurality of layers may have a structure resulting from stacking layers in the first direction X.

The plurality of layers may constitute the front cover 70 by being bonded in the first direction X.

One of the plurality of layers may be an anti-glare layer, although not limited thereto. However, the layer may be an anti-reflective layer or a layer formed by combining an anti-glare layer with an anti-reflective layer.

Another one of the plurality of layers may be a light transmittance adjustable layer, although not limited thereto. However, the layer may be a layer having another physical property or including another material, or a layer having another function. For example, the layer may be a circularly polarized layer.

However, the front cover 70 may include a single layer, instead of the plurality of layers. The single layer may be a layer capable of implementing all functions of the plurality of layers.

As described above, the front cover 70 may include an adhesive layer. The adhesive layer may be positioned at a hindmost location of the plurality of layers in the first direction X and bonded on the mounting surface 41. The adhesive layer may have a height that is greater than or equal to a preset height in the first direction X in which the mounting surface 41 or the light-emitting surface 54 faces.

The reason may be to cause the adhesive layer bonded on the substrate 40 to sufficiently fill a gap that may be formed between the adhesive layer and the plurality of inorganic light-emitting devices 50.

However, the adhesive layer is not limited to the embodiment of the disclosure, and the adhesive layer may be positioned as a separate component from the front cover 70 between the front cover 70 and the mounting surface 41 to bond the front cover 70 with the mounting surface 41.

Accordingly, because the front cover 70 is bonded with the mounting surface 41 while being in close contact with the mounting surface 41 and protects components mounted on the mounting surface 41, the front cover 70 may be bonded directly to the substrate 40 without any additional molding component formed between the front cover 70 and the substrate 40.

The front cover 70 may diffuse and reflect light received from the outside to prevent the light from being specularly reflected and produce glare.

By diffusing and reflecting light received from the outside, a glaring phenomenon may be reduced, and accordingly, contrast of a screen displayed on the display panel 20 may be improved.

Also, the front cover 70 may reduce transmittance of incident external light or external light reflected from the substrate 40 and the gap G.

The front cover 70 according to an embodiment of the disclosure may include a material capable of reducing transmittance of light, to absorb at least one part of light transmitted toward the substrate 40 or light reflected from the substrate 40 and then traveling toward the first direction X.

Some of a plurality of substrates may be manufactured with different colors due to a matter of process. Accordingly, substrates having different unique colors may be tiled to constitute a single display panel.

As described above, the front cover 70 according to an embodiment of the disclosure may absorb at least one part of light reflected from the substrate 40 and transmitted to the outside, thereby raising a sense of unity of a screen displayed on the display panel 20.

That is, the front cover 70 may reduce color deviation generated during processes of the plurality of display modules 30A to 30P by lowering transmittance with respect to external light.

The front cover 70 may prevent external light entered the display panel 20 from the outside from being transmitted to the substrate 40, and additionally absorb a part of light entered the display panel 20 from the outside or a part of external light reflected from the substrate 40 and then transmitted to the outside of the display panel 20, thereby improving contrast of a screen that is displayed on the display panel 20. Such different optical actions may be respectively implemented by the plurality of layers described above.

That is, the front cover 70 may be positioned in front of the substrate 40 in the first direction X to improve contrast that may deteriorate by external light in a screen displayed on the display panel 20.

As described above, in the display module 30 according to an embodiment of the disclosure, the front cover 70 may extend up to the outside of the substrate 40 in the second direction Y.

Accordingly, a part of light entered the gap G formed between the plurality of display modules 30A to 30P may be blocked by at least one portion of the front cover 70 positioned in the gap G, and at least a part of external light entered the gap G or reflected in the gap G may be absorbed by the front cover 70 positioned in the gap G and thus be not transmitted to the outside. Accordingly, visibility of a seam that is formed in the gap G may deteriorate, and due to the deterioration of the visibility of the seam, a sense of unity of a screen that is displayed on the display panel 20 may be improved.

More specifically, the side end 75 of the front cover 70 in the second direction Y may be positioned at an outer location than the edge 41S of the mounting surface 41 in the second direction Y, or in the gap G.

Accordingly, the front cover 70 may include a first area 71 positioned at the outer location than the edge 41S of the mounting surface 41 in the second direction Y or in the gap G, and a second area 72 above the mounting surface 41.

The first area 71 and the second area 72 of the front cover 70 may be partitioned by the gap G in the second direction Y.

Because the first area 71 of the front cover 70 is positioned in the gap G, external light irradiated toward the gap G may be blocked by the first area 71 of the front cover 70 or light reflected in the gap G may be prevented from being irradiated to the outside. Accordingly, visibility of a seam which is a boundary between the plurality of display modules 30A to 30P and which may be formed by the gap G may be reduced, resulting in an improvement of a sense of unity of the display panel 20.

Because the front cover 70 extends up to the outer location than the four edges 41S of the mounting surface 41 of the substrate 40, as described above, visibility of seams that may be formed at the edges of the plurality of display modules 30A to 30P may be reduced.

In the example of the first display module 30A and the second display module 30E, a first area 71A of a first front cover 70A extending from the first display module 30A may be positioned in a gap G formed between the first display module 30A and the second display module 30E.

In the gap G, neighboring side ends 75A and 75E of the front covers 70A and 70E of the first and second display modules 30A and 30E may be positioned.

Also, in the gap G, the side surfaces 45 and chamfer portions 49 of the first and second display modules 30A and 30E may be positioned.

A second area 72A of the first front cover 70A may be positioned above the mounting surface 41 of the first display module 30A.

A first area 71E of the second cover 70E extending from the second display module 30E may be positioned in the gap G formed between the first display module 30A and the second display module 30E, and a second area 72E of the second front cover 70E may be positioned above the mounting surface 41 of the second display module 30E.

In the gap G formed between the first display module 30A and the second display module 30E, the first areas 71A and 71E of the first and second front covers 70A and 70E may be positioned side by side in the second direction Y.

Lengths in second direction Y of the first areas 71A and 71E of the first and second front covers 70A and 70E may be substantially smaller than or equal to half of a length of the gap G.

Accordingly, a sum of the lengths of the first areas 71A and 71E of the first and second front covers 70A and 70E arranged side by side in the second direction Y may substantially correspond to or be smaller than the length of the gap G.

In some arrangements, in a case in which the first areas 71A and 71E of the first and second front covers 70A and 70E are arranged side by side in the second direction Y, a certain space may be formed between the side end 75A of the first cover 70A and the side end 75E of the second cover 70E.

However, the space may correspond to a very small value that may not be noticeable to a user. Accordingly, the first display module 30A and the second display module 30E may be tiled without any substantially great space between the first area 71A of the first front cover 70 and the first area 71E of the second cover 70E.

The first area 71A of the first front cover 70A and the first area 71E of the second front cover 70E may be positioned in the gap G between the first display module 30A and the second display module 30E, as described above.

External light entered the display panel 20 may be diffused and reflected to the outside of the display panel 20 while being transmitted through the first areas 71A and 71E of the first and second front covers 70A and 70E, or a part of the external light may be absorbed in the first areas 71A and 71E. Accordingly, an amount of the external light arrived at the gap G may be reduced, which reduces visibility of a boundary between the first display module 30A and the second display module 30E, caused by the gap G.

Also, light reflected in the gap G and then traveling to the outside of the display panel 20 may be diffused and reflected to the outside of the display panel 20 while being transmitted through the first areas 71A and 71E of the first and second front covers 70A and 70E, or a part of the light may be absorbed in the first areas 71A and 71E. Accordingly, an amount of light transmitted to the outside of the display panel 20 may be reduced, which reduces visibility of a boundary between the first display module 30A and the second display module 30E, caused by the gap G.

That is, by reducing an amount of external light entering the gap G formed between the plurality of display modules 30A to 30P while absorbing at least one part of the external light reflected in the gap G, a sense of unity of a screen displayed on the display panel 20 may be improved.

Additionally, although a substrate 40A of the first display module 30A and a substrate 40E of the second display module 30E have different colors, at least one part of external light reflected from the substrates 40A and 40B may be absorbed in the first and second front covers 70A and 70E. Accordingly, unique colors of the substrates 40A and 40E may be not recognized from the outside, which improves a sense of unity of a screen displayed on the display panel 20.

The display module 30A may include the side cover 90 positioned below the front cover 70 in the direction in which the mounting surface 41 faces and provided on the side surface 45 of the substrate 40.

More specifically, the side cover 90 may be positioned in a space defined by a lower surface 76 of the first area 71 of the front cover 70 in the first direction X and the side surface 45 of the substrate 40 in the second direction Y.

The side cover 90 may be in contact with the lower surface 76 of the first area 71, the side surface 45, and at least one portion of the metal plate 60. Preferably, the side cover 90 may be in contact with the entire of the lower surface 76 of the first area 71. Also, preferably, the side cover 90 may cover the entire area of the side surface 45.

Herein, the lower surface 76 of the first area 71, which is a lower surface of the front cover 70, may be a rear surface of the adhesive layer (not shown) formed as the hindmost layer of the front cover 70.

Also, the side cover 90 may cover all of a pair of chamfer portions 49 located at front and rear portions of the side surface 45 in the first direction X.

Also, the side cover 90 may surround the entire of the chamber portion 49 formed between the mounting surface 41 and the side surface 45, as well as the side surface 45.

Because the side cover 90 surrounds the chamfer portion 49 formed between the mounting surface 41 and the side surface 45, the side cover 90 may fill the entire of a space that may be defined between the substrate 40 and the front cover 70.

Accordingly, the side cover 90 may prevent a foreign material or water from the outside from entering the space between the substrate 40 and the front cover 70.

Also, because the side cover 90 surrounds the chamfer portion 49 formed between the rear surface 43 and the side surface 45, the side cover 90 may fill the entire of a space that may be defined between the substrate 40 and the metal plate 60.

Accordingly, the side cover 90 may prevent a foreign material or water from the outside from entering the space between the substrate 40 and the metal plate 60.

The side cover 90 may be in contact with the lower surface 76 of the first area 71, the chamfer portion 49 of the substrate 40, and the side surface 45. Accordingly, the side cover 90 may support the lower surface 76 of the first area 71, the chamfer portion 49 of the substrate 40, and the side surface 45.

As described above, the substrate 40 may be bonded with the front cover 70 by the front cover 70, and the side cover 90 may reinforce an adhesive property between the substrate 40 and the front cover 70. Accordingly, the side cover 90 may prevent the front cover 70 from departing from the substrate 40.

That is, the side cover 90 may raise reliability of the display module 30.

Also, the substrate 40 may be bonded with the metal plate 60 by the rear adhesive tape 61, and the side cover 90 may reinforce an adhesive property between the metal plate 60 and the substrate 40. Accordingly, the side cover 90 may prevent the metal plate 60 from departing from the substrate 40.

As described above, the side surface 45 of the substrate 40 may correspond to the four edges 41S of the mounting surface 41, and the first area 71 of the front cover 70 may extend up to the outer location than the four edges 41S of the mounting surface 41 in the second direction Y and the third direction Z in which the mounting surface 41 extends.

The side cover 90 may surround the lower surface 76 of the first area 71 and the side surface 45 corresponding to the four edges 41S of the mounting surface 41, along the four edges 41S of the mounting surface 41.

That is, the side cover 90 may seal an entire edge of a portion at which the substrate 40 is bonded with the front cover 70.

The side cover 45 may cover the side surface 54 and the lower surface 76 of the first area 71 in all directions that are orthogonal to the first direction X.

Accordingly, a coupling force between the front cover 70 and the substrate 40 may be improved, and the front cover 70 and the side surface 45 of the substrate 40 may be protected from an external force.

Also, a foreign material or water from the outside may be prevented from entering between the substrate 40 and the front cover 70, as described above. In addition, upon formation of a gap between the substrate 40 and the front cover 70 due to degradation of adhesion, outside water or a foreign material may be prevented from entering the gap.

Because the side cover 90 surrounds all the four edges E of the substrate 40 along the side surface 45 of the substrate 40, an effect of sealing the substrate 40, the front cover 70, and the metal plate 60 may be obtained.

Accordingly, the side cover 90 may prevent a foreign material or water from entering between the substrate 40 and the front cover 70 in all directions in which the foreign material or water may enter the substrate 40.

Because the hindmost layer of the front cover 70 in the first direction X is the adhesive layer, as described above, the lower surface 76 of the first area 71 may be a rear surface of the adhesive layer.

Accordingly, upon exposure of the lower surface 76 of the first area 71 to the outside, a foreign material floating in the outside may be adhered to the lower surface 76 of the first area 71.

Upon an arrangement of the plurality of display modules 30A to 30P in a state in which a foreign material is adhered to the lower surface 76 of the first area 71, visibility of a seam generated between the plurality of display modules 30A to 30P may be raised by the foreign material adhered to the lower surface 76 of the first area 71.

However, because the display module 30A according to an embodiment of the disclosure includes the side cover 90, and the side cover 90 covers the lower surface 76 of the first area 71, the display module 30A may prevent a foreign material from being adhered to the lower surface 76 of the first area 71.

Accordingly, visibility of a seam generated between the plurality of display modules 30A to 30P due to a foreign material adhered to the front cover 70 upon an arrangement of the plurality of display modules 30A to 30P may be reduced.

Also, current may flow to a plurality of electronic components mounted on the substrate 40 by an electrostatic discharge which may be generated on the display modules 30A to 30P to damage the electronic components, and the side cover 90 may seal the substrate 40 from the outside and thus block charges generated by an electrostatic discharge from entering the substrate 40, to prevent the electronic components from being damaged, which will be described later.

That is, because the substrate 40 is sealed by the front cover 70 and the side cover 90, charges generated by an electrostatic discharge may be prevented from passing through the front cover 70 and the side cover 90 and thus flowing to the substrate 40. Also, charges flowing on the front cover 70 and the side cover 90 may be guided to the metal plate 60 being in contact with the side cover 90, thereby providing a path for current generated by an electrostatic discharge. Accordingly, electrostatic discharge (ESD) internal pressure of the electronic components mounted on the substrate 40 may be improved.

As described above, the display module 30A may be positioned below the front cover 70 in the direction in which the mounting surface 41 faces. That is, the side cover 90 may be not positioned above the lower surface 76 in the first direction X.

A most front surface 92 of the side cover 90 in the first direction X may be in contact with the lower surface 76 of the first area 71, and may be not positioned before the lower surface 76 of the first area 71 in the first direction X.

The reason may be not to locate the side cover 90 on a traveling path of light emitted from the plurality of inorganic light-emitting devices 50.

In a case in which at least one portion of the side cover 90 is positioned before the lower surface 76 or the front cover 70 in the first direction X, the at least one portion of the side cover 90 may be positioned on a traveling path of light traveling forward through the front cover 70.

That is, the side cover 90 may absorb or diffuse and reflect a part of traveling light to distort an area of an image displayed on the display panel 20.

However, because the side cover 90 according to an embodiment of the disclosure is positioned behind the front cover 70 in the first direction X, the side cover 90 may not limit traveling of light emitted from the plurality of light-emitting devices 50, thereby improving image quality of the display panel 20.

The side end 75 of the front cover 70 in the second direction Y and a side end 91 of the side cover 90 in the second direction Y may be on the substantially same line in the first direction X.

The reason may be because the front cover 70 and the side cover 90 are cut simultaneously in a process of manufacturing the display module 30A. Also, the side end member 100 may be bonded on the side end 75 of the front cover 70 and the side end 91 of the side cover 90, positioned on the substantially same line in the first direction X.

That is, a space that may be formed between the plurality of display modules 30A to 30P upon an arrangement of the plurality of display modules 30A to 30P may be reduced, and visibility of a seam, which is caused by the space between the plurality of display modules 30A to 30P, may be reduced.

The side cover 90 may include a light absorbing material. For example, the side cover 90 may be formed of an opaque or translucent material.

Also, the side cover 90 may include a photosensitive material. For example, the side cover 90 may be formed of a photosensitive OCR. The photosensitive material may change physical properties to show a dark color by receiving external light, such as ultraviolet (UV) light, having a wavelength that is different from that of visible light.

Accordingly, by irradiating UV light to the side cover 90 during a manufacturing process to color the side cover 90 with a dark color, the side cover 90 may be provided as a light absorbing member.

The side cover 90 may have a dark color. The side cover 90 may have a darker color that the front cover 70.

Preferably, the side cover 90 may have a color that is similar to a color of the black matrix 48.

Accordingly, light entered the side cover 90 may be absorbed in the side cover 90 without being reflected, by the light absorbing member of the side cover 90.

The side cover 90 may be positioned in the gap G formed between the plurality of display modules 30A to 30P, together with the first area 71 of the front cover 70, upon an arrangement of the plurality of display modules 30A to 30P.

Accordingly, by absorbing light entered the gap G, an amount of light reflected and then emitted to the outside among the light entered the gap G may be reduced. Therefore, visibility of a seam formed by the gap G formed between the plurality of display modules 30A to 30P may be reduced.

In the example of the first display module 30A and the second display module 30E, the first side cover 90A of the first display module 30A and the second side cover 90E of the second display module 30E may be positioned in the gap G formed between the first display module 30A and the second display module 30E, together with the first area 71A of the first cover 70A and the first area 71E of the second cover 70E.

In the gap G, neighboring side ends 90A and 90E of the side covers 90A and 90E may be positioned together with the neighboring side ends 75A and 75E of the front covers 70A and 70E of the first and second display modules 30A and 30E.

The neighboring side ends 75A and 75E of the front covers 70A and 70E and the neighboring side ends 90A and 90E of the side covers 90A and 90E may be opposite to each other. Preferably, the neighboring side ends 75A and 75E of the front covers 70A and 70E and the neighboring side ends 90A and 90E of the side covers 90A and 90E may be positioned in parallel to each other.

That is, in the gap G formed between the first display module 30A and the second display modules 30E, the first areas 71A and 71E of the first and second front covers 70A and 70E and the first and second side covers 90A and 90E may be positioned in parallel in the second direction Y.

Lengths in second direction Y of the first and second side covers 90A and 90E may be substantially smaller than or equal to half of the length of the gap G to correspond to the first areas 71A and 71E of the first and second front covers 70A and 70E.

In the gap G between the first display module 30A and the second display module 30E, the first area 71A of the first front cover 70A and the first area 71E of the second front cover 70E may be positioned, and the first and second side covers 90A and 90E may be positioned behind the first areas 71A and 71E in the first direction X.

External light entered the display panel 20 may be diffused and reflected to the outside of the display panel 20 by being transmitted through the first areas 71A and 71E of the first and second front covers 70A and 70E, or a part of the external light may be absorbed in the first areas 71A and 71E of the first and second front covers 70A and 70E. Accordingly, an amount of light arrived at the gap G may be reduced.

In addition, light arrived at the gap G may be absorbed in the first and second side covers 90A and 90E positioned in the gap G, and accordingly, visibility of a boundary between the first display module 30A and the second display module 30E may be reduced.

That is, by reducing an amount of external light entering the gap G formed between the plurality of display modules 30A to 30P and additionally absorbing light arrived at the gap G, a sense of unity of a screen displayed on the display panel 20 may be improved.

In addition, light reflected from the first and second side covers 90A and 90B without being absorbed in the first and second side covers 90A and 90E and then traveling to the outside of the display panel 20 may be diffused and reflected to the outside of the display panel 20 by being transmitted through the first areas 71A and 71E of the first and second front covers 70A and 70E, or a part of the light may be absorbed in the first areas 71A and 71E. Accordingly, an amount of light transmitted to the outside of the display panel 20 may be reduced, and thus, visibility of the boundary between the first display module 30A and the second display module 30E, caused by the gap G, may be reduced.

Because the side cover 90 is positioned in the gap G formed between the plurality of display modules 30A to 30P upon an arrangement of the plurality of display modules 30A to 30P, as described above, the side cover 90 may absorb light arrived at the gap G to reduce visibility of a seam, caused by the gap G.

In the above-described example, the front cover 70 may diffuse and reflect, absorb, or circularly polarize a part of light entered the display panel 20, or change a reflection direction of the part of the light, thereby reducing an amount of light that arrives at the substrate 40, although not limited thereto.

However, the front cover 70 may be formed of a transparent material to transmit light without any deformation. In this case, visibility of the boundary between the plurality of display modules 30A to 30P, caused by the gap G, may be reduced by the side cover 90 positioned between the plurality of display modules 30A to 30P.

Because the side cover 90 is formed of a light absorbing material, as described above, a part of light emitted from the plurality of inorganic light-emitting devices 50 may be absorbed in the side cover 90 in a case in which at least one portion of the side cover 90 is positioned before the front cover 70 in the first direction X. Accordingly, an area of a screen displayed on the display panel 20 may appear dark.

However, because the side cover 90 according to an embodiment of the disclosure is positioned below the front cover 70 in the first direction X, more specifically, below the lower surface 76 of the first area 71, the side cover 90 may not absorb light emitted from the plurality of inorganic light-emitting devices 50, and accordingly, brightness of an image displayed on the display panel 20 may be uniform.

As shown in FIGS. 8 and 9, the front cover 70 may extend up to the outer location than the substrate 40 in the third direction Z. More specifically, the front cover 70 may extend up to the outer location than the side surface 45 and the chamfer portion 49 in the third direction Z.

The side end 75 of the front cover 70 in the third direction Z may be positioned at the outer location than the edge 41S of the mounting surface 41 in the third direction Z, or in the gap G.

The first area 71 and the second area 72 of the front cover 70 may be partitioned by the gap G in the third direction Z.

In an example of the first display modules 30A and the third display module 30B, the first area 71A of the first front cover 70A extending from the first display module 30A may be positioned in a gap G formed between the first display module 30A and the third display module 30B.

In the gap G, neighboring side ends 75A and 75B of the front covers 70A and 70B of the first and third display modules 30A and 30B may be positioned.

Also, the side surfaces 45 and chamfer portions 49 of the first and third display modules 30A and 30B may be positioned in the gap G.

A first area 71B of a third front cover 70B extending from the third display module 30B may be positioned in the gap G formed between the first display module 30A and the third display module 30B, and a second area 72B of the third front cover 70B may be positioned above the mounting surface 41 of the third display module 30B.

That is, in the gap G between the first display module 30A and the third display module 30B, the first areas 71A and 71B of the first and third front covers 70A and 70B may be positioned side by side in the third direction Z.

External light entered the display panel 20 may be diffused and reflected to the outside of the display panel 20 by being transmitted through the first areas 71A and 71B of the first and third front covers 70A and 70B, or a part of the external light may be absorbed in the first areas 71A and 71B. Accordingly, an amount of light arrived at the gap G may be reduced, and visibility of a boundary between the first display module 30A and the third display module 30B, caused by the gap G, may be reduced.

Also, light reflected in the gap G and then traveling to the outside of the display panel 20 may be diffused and reflected to the outside of the display panel 20 by being transmitted through the first areas 71A and 71B of the first and third front covers 70A and 70B, or a part of the light may be absorbed in the first areas 71A and 71B. Accordingly, an amount of light transmitted to the outside of the display panel 20 may be reduced, and visibility of the boundary between the first display module 30A and the third display module 30B, caused by the gap G, may be reduced.

As described above, the side cover 90 may be positioned in a space formed in the side surface 45 of the substrate 40 in the second direction Y and the third direction Z.

On the side surface 54 of the substrate 40 extending in the third direction Z, the side wiring 46 may be positioned. Accordingly, the side cover 90 provided on the side surface 45 extending in the third direction Z may surround the side wiring 46, as well as the side surface 45 and the chamfer portion 49. Accordingly, the side cover 90 may protect the side wiring 46 from an external force, and prevent a foreign material or water from entering the side wiring 46.

That is, the side cover 90 may surround the side wiring 46 extending along the side surface 45 in the third direction Z by surrounding the lower surface 76 of the first area 71 and the side surface 45 corresponding to the four edges 41S of the mounting surface 41 along the four edges 41S of the mounting surface 41.

Accordingly, binding between the front cover 70 and the substrate 40 may be improved, and the front cover 70, the side surface 45 of the substrate 40, and the side wiring 46 may be protected from an external force.

The side end 70 of the front cover 70 in the third direction Z and the side end 91 of the side cover 90 in the third direction Z may be on the same line in the first direction X. Preferably, the side end 70 of the front cover 70 and the side end 91 of the side cover 90 may be positioned on the same line in a direction that is in parallel to the first direction X.

In the example of the first display module 30A and the third display module 30B, the first side cover 90A of the first display module 30A and the third side cover 90B of the third display module 30B may be positioned in the gap G formed between the first display module 30A and the third display module 30B, together with the first area 71A of the first front cover 70A and the third area 71B of the third front cover 70B.

In the gap G, neighboring side ends 91A and 91B of the side covers 90A and 90B may be positioned together with the neighboring side ends 75A and 75B of the first and third front covers 70A and 70B of the first and third display modules 30A and 30B.

The neighboring side ends 75A and 75B of the first and third front covers 70A and 70B and the neighboring side ends 91A and 91B of the side covers 90A and 90B may be opposite to each other.

Preferably, the neighboring side ends 75A and 75B of the first and third front covers 70A and 70B and the neighboring side ends 90A and 90B of the side covers 90A and 90B may be positioned in parallel to each other.

That is, in the gap G formed between the first display module 30A and the third display module 30B, the first areas 71A and 71B of the first and third front covers 70A and 70B and the first and third side covers 90A and 90B may be positioned side by side in the third direction Z.

Because the side end 75 of the front cover 70 and the side end 91 of the side cover 90 in the third direction Z are formed on the same line in the first direction X and the side end member 100 is bonded to the side end 75 of the front cover 70 and the side end 91 of the side cover 90 in the third direction Z, a space that may be formed between the first and third display modules 30A and 30B upon an arrangement of the first and third display modules 30A and 30B may be reduced.

In the gap G formed between the first display module 30A and the third display module 30B, the first areas 71A and 71B of the first and third front covers 70A and 70B and the first and third side covers 90A and 90B may be arranged side by side in the third direction Z.

In the gap G formed between the first display module 30A and the third display module 30B, the first area 71A of the first front cover 70A and the first area 71B of the third front cover 70B may be arranged, and the first and third side covers 90A and 90B may be arranged behind the first areas 71A and 71B in the first direction X.

As described above, external light entered the display panel 20 may be diffused and reflected to the outside of the display panel 20 by being transmitted through the first areas 71A and 71B of the first and third front covers 70A and 70B, or a part of the external light may be absorbed in the first areas 71A and 71B. Accordingly, an amount of light arrived at the gap G may be reduced.

In addition, light arrived at the gap G may be absorbed in the first and third side covers 90A and 90B positioned in the gap G, and accordingly, visibility of the boundary between the first display module 30A and the third display module 30B may be reduced.

Light reflected from the first and third side covers 90A and 90B and then traveling to the outside of the display panel 20 without being absorbed in the first and third side covers 90A and 90B may be diffused and reflected to the outside of the display panel 20 by being transmitted through the first areas 71A and 71B of the first and third front covers 70A and 70B, or a part of the light may be absorbed in the first areas 71A and 71B. Accordingly, an amount of light transmitted to the outside of the display panel 20 may be reduced, and visibility of the boundary between the first display module 30A and the second display module 30B, caused by the gap G, may be reduced.

The side cover 90 may be applied with a preset amount by a dispenser in a manufacturing process. The side cover 90 may be hardened through a follow-up task. The side cover 90 may be formed of, for example, a nonconductive black resin.

The side cover 90 may cover all of a rear surface of the front cover 70, the side surface 45 of the substrate 40, the chamfer portion 49 formed between the mounting surface 41 and the side surface 45, and the chamfer portion 49 formed between the side surface 45 and the rear surface 43.

Also, an area of the anisotropic conductive layer 47, positioned at an outer location than the mounting surface 41, may be covered by the side cover 90.

A task of dispensing the side cover 90 may be performed on all the four edges of the substrate 40. Accordingly, the side cover 90 may be dispensed to cover the entire of the side surface 45 of the substrate 40. Also, the entire of the area of the anisotropic conductive layer 47, positioned at the outer location than the mounting surface 41, may be covered by the side cover 90.

As the side cover 90 is hardened, the side cover 90 may be in contact with the rear surface of the front cover 70 with respect to the first direction X, the side surface 45 of the substrate 40, the chamfer portion 49 formed between the side surface 45 and the mounting surface 41, and the anisotropic conductive layer 47.

The side cover 90 may include a photosensitive material. In this case, by irradiating ultraviolet light or the like onto the side cover 90, as a follow-up task, the side cover 90 may be colored with a dark color. However, the side cover 90 may be formed of a translucent or opaque material without including any photosensitive material. In this case, a process of coloring the side cover 90 may be not required.

As described above, the anisotropic conductive layer 47 may be in a form of an anisotropic conductive film. The anisotropic conductive layer 47 may be bonded in a form of a film with the TFT layer 41, which will be described in detail.

Because the anisotropic conductive layer 47 is in the form of the film, an area of the anisotropic conductive layer 47 may be larger than an area of the substrate 40.

Accordingly, after the anisotropic conductive layer 47 is bonded with the TFT layer 44, a process of cutting the anisotropic conductive layer 47 to correspond the area of the anisotropic conductive layer to the area of the substrate 40 may be performed.

The cutting process may be to cut the anisotropic conductive layer 47 through laser cutting, etc. to correspond the area of the anisotropic conductive layer 47 to the area of the substrate 40.

The anisotropic conductive layer 47 may have an area corresponding to an area of the mounting surface 41. However, it may be not easy to form the anisotropic conductive layer 47 as an anisotropic conductive film, as described above, of which an area corresponds to the area of the mounting surface 41, and, upon bonding of the anisotropic conductive film having the area corresponding to the area of the mounting surface 41 onto the mounting surface 41, the anisotropic conductive film may have a smaller cross-sectional area than that of the mounting surface 41 due to manufacturing tolerance, which deteriorates reliability of the display module 30.

Accordingly, by bonding an anisotropic conductive film having a larger area than that of the mounting surface 41 with the substrate 40 and then cutting the anisotropic conductive film to an area corresponding to the area of the substrate 40, the anisotropic conductive layer 47 may be formed.

The side surface 45 of the substrate 40 may be positioned to the outside of the mounting surface 41 by the chamfer portion 49. In this case, preferably, the anisotropic conductive film may be cut based on the side surface 45 of the substrate 40 in the second direction Y and a side end 46S of the side wiring 46 in the third direction Z.

The reason may be because, as a result of cutting the anisotropic conductive film based on the mounting surface 41, the side surface 45 of the substrate 40, the chamfer portion 49, or the side wiring 46 may be damaged.

Accordingly, upon cutting of the anisotropic conductive film, a side end 47S of the anisotropic conductive layer 47 may be positioned at an outer location than the mounting surface 41. More specifically, because the anisotropic conductive film is cut based on the side surface 45 or the side end 46S of the side wiring 46, as described above, the side end 47S of the anisotropic conductive layer 47 may be, preferably, on the same line as the side surface 45 or the side end 46S of the side wiring 46 in the first direction X. Also, due to manufacturing tolerance or upon cutting, the anisotropic conductive layer 47 may be positioned at an outer location than the side surface 45 or the side end 46S of the side wiring 46 by burr molded in the anisotropic conductive film.

However, to prevent breakage of the substrate 41, which may actually occur in a cutting process, a location at which the anisotropic conductive film is cut may be an outer location than the side surface 45 or the side end 46S of the side wiring 46.

Accordingly, the side end 47S of the anisotropic conductive layer 47 may be positioned outside the substrate 40. Particularly, the side end 47S of the anisotropic conductive layer 47 may be positioned at the outer location than the side cover 90.

In the case in which the side end 47S of the anisotropic conductive layer 47 is positioned at the outer location than the side cover 90, the side end 47S of the anisotropic conductive layer 47 may be positioned in the gap G between the plurality of display modules 30A to 30P. Accordingly, the side end 47S of the anisotropic conductive layer 47 between the plurality of display modules 30A to 30P may be recognized as a seam, which deteriorates a sense of unity of a screen displayed on the display panel 20.

Also, current generated by an electrostatic discharge may enter the display module 30 through the side end 47S of the anisotropic conductive layer 47 to damage electronic components installed in the display module 30.

That is, according to an electrostatic discharge caused around the display module 30, electricity of a high voltage may enter the inside of the display module 30 through the side end 47S of the anisotropic conductive layer 47, exposed to the outside, to damage the display module 30.

To prevent the display module 30 from being damaged, in the display apparatus 1 according to an embodiment of the disclosure, the side end 47S of the anisotropic conductive layer 47 may be positioned at an inner location than the side end 75 of the front cover 70, as shown in FIGS. 7 and 9. More specifically, the side end 47S of the anisotropic conductive layer 47 may be positioned on the first area 71.

Accordingly, the side end 47S of the anisotropic conductive layer 47, extending up to the outer location than the mounting surface 41 of the substrate 40, may extend up to the first area 71.

The display module 30 may include, as described above, the side cover 90 positioned to the outer location than the substrate 40, and the side end 47S of the anisotropic conductive layer 47 may be covered by the side cover 90 although the side end 47S of the anisotropic conductive layer 47 is positioned to the outer location than the substrate 40.

Because the side end 47S of the anisotropic conductive layer 47 is not exposed to the outside by the side cover 90, recognition of a seam by the side end 47S of the anisotropic conductive layer 47 may be prevented, and current may be prevented from entering the side end 47S of the anisotropic conductive layer 47.

That is, although the side end 47S of the anisotropic conductive layer 47 is positioned at the outer location than the substrate 40, the side end 47S of the anisotropic conductive layer 47 may be covered by the side cover 90, thereby preventing the display module 30 from being damaged. However, in a case in which the side end 47S of the anisotropic conductive layer 47 extends up to an outer location than the side cover 90, the side end 47S of the anisotropic conductive layer 47 may be exposed to the outside of the display module 30, and accordingly, the side end 47S of the anisotropic conductive layer 47 may be positioned at the inner location than the side end 91 of the side cover 90.

As described above, because the side end 91 of the side cover 90 is on the same line as the side end 75 of the front cover 70, the side end 47S of the anisotropic conductive layer 47 may be positioned at an inner location than the side end 75 of the front cover 70, although not limited thereto.

However, the anisotropic conductive layer 47 may have a size of an area corresponding to the mounting surface 41 to be positioned on the same line as the edge 41S of the mounting surface 41.

That is, unlike the above description, the anisotropic conductive layer 47 may be formed as a film having a size corresponding to the area of the mounting surface 41, and overlap with the mounting surface 41 in the first direction X without requiring a cutting process. In this case, the side end 47S of the anisotropic conductive layer 47 may be positioned at the inner location than the side surface 45.

The side cover 90 may cover an outer side in third direction Z of the side surface 45 of the substrate 40 and an outer side in second direction Y of the side surface 45, as shown in FIGS. 7 and 9.

That is, as described above, the side cover 90 may surround all the four edges E of the substrate 40.

Accordingly, the mounting surface 41 which is a front surface of the substrate 40 may be covered by the front cover 70, the rear surface 43 of the substrate 40 may be covered by the metal plate 60, and the side surface 45 and the chamfer portion 49 of the substrate 40 may be covered by the side cover 90.

Particularly, the side cover 90 may extend from an upper portion of the metal plate 90 to the rear end 76 of the front cover 70 in the first direction X, thereby completely sealing the substrate 40 from the outside.

The front cover 70 may be formed of a nonconductive material through which no charges are transmitted.

The side cover 90 may be formed of a nonconductive material through which no charges are transmitted.

Because the front cover 70 and the side cover 90 are formed of a nonconductive material, a major portion of current applied to the front cover 70 or the side cover 90 may float on the front cover 70 and the side cover 90 without being transmitted through the front cover 70 and the side cover 90.

Also, the metal plate 60 may be formed of a material having great capacitance, and function as a ground component. Accordingly, upon application of current to the metal plate 60, the metal plate 60 may be maintained at a constant potential, and the current applied to the metal plate 60 may be absorbed in the metal plate 60 without flowing to the substrate 40 through the metal plate 60.

That is, in the display apparatus 1, the entire of the side wiring 46 of the substrate 40 may be surrounded by the side cover 90, and accordingly, the side wiring 46 may be not exposed to the outside and sealed. Therefore, although an electrostatic discharge occurs at the side surface 45 of the substrate 40, no current may enter the side wiring 46 by the side cover 90. In a process of manufacturing a display apparatus by implementing a display panel with display modules, a plurality of display modules may be tiled to form the display panel. In a process of forming the display panel with the display modules, current generated by an electrostatic discharge while the display modules are manufactured and delivered may enter the insides of the display modules to damage electronic components installed inside the display modules.

Particularly, during a process of manufacturing the display module 30, a defect may be generated, and in this case, the side wiring 46 extending along the side surface 45 of the substrate 40 or the anisotropic conductive layer 47 may be exposed to the outside, and due to a faulty connection of the front cover 70 and the substrate 40, a space may be made or an inside space may be made in a process of applying and hardening the side cover 90. In this case, according to an electrostatic discharge, current may enter the space made by the defect, the anisotropic conductive layer 47, or the side wiring 46 to damage electronic components mounted on the substrate 40.

The display module 30 may include the front cover 70, the side cover 90, and the metal plate 60 for absorbing any electrical impact to prevent current generated by an electrostatic discharge from entering the display module 30 to damage electronic components installed inside the display module 30 from before the display module 30 is coupled with the frame 15 and then assembled into the display apparatus 1.

More specifically, each of the display modules 30A to 30P of the display apparatus 1 according to an embodiment of the disclosure, as described above, may include the side cover 90 extending from the upper portion of the metal plate 60 to the lower end 76 of the first area 71 of the front cover 70, positioned at the outer location than the mounting surface 41 in the first direction X which the mounting surface 41 faces, to seal the side surface 45 from the outside.

Accordingly, each of the display modules 30A to 30P may independently include a component for blocking current generated by an electrostatic discharge from entering components mounted on the substrate 40, and the current generated by the electrostatic discharge may be easily guided to the metal plate 60 which is a ground component along the front cover 70 and the side cover 90 sealing the substrate 40 on each of the display modules 30A to 30P without entering the components mounted on the substrate 40.

However, the electronic components may be damaged by a defect generated in a process of manufacturing the display modules 30A to 30P, as described above.

To prevent the electronic components from being damaged in the manufacturing process, the display apparatus 1 according to an embodiment of the disclosure may further include the side end member 100 positioned on an outer side end of the side cover 90 in the second direction Y and the third direction Z of the display module 30 and formed of a material having higher conductivity than the side cover 90.

The side end member 100 may easily guide static electricity to the metal plate 60 although the display modules 30A to 30P are insufficiently sealed due to a defect caused during a manufacturing process.

Because the display modules 30A to 30P have the same configuration, only the first display module 30A will be described as a representative, below. The side end member 100 may cover both the outer side in third direction Z of the side surface 45 of the substrate 40 and the outer side in second direction Y of the side surface 45, as shown in FIGS. 7 and 9.

That is, the side end member 100 may surround all the four edges E of the substrate 40.

The side end member 100 may be formed of, preferably, a metal material having higher conductivity than the side cover 90. The side end member 100 may be coated on the side cover 90 and positioned on an outer side end of the side cover 90.

Accordingly, the side end member 100 may be positioned in the gap G formed between the display modules 30A to 30P upon an arrangement of the display modules 30A to 30P.

The side end member 100 may include a first portion 101a being in contact with the metal plate 60, and a second portion 102 connected to the first portion 101 and positioned on the side end 91 of the side cover 90. The first portion 101 may be grounded to the metal plate 60, and the first portion 101 of the side end portion 100 may be in contact with a side surface 60a in second direction Y or third direction Z of the metal plate 60.

The second portion 102 of the side end member 100 may be in contact with at least one portion of the side cover 90. An upper end 103 in first direction X of the second portion 102 may be spaced a preset distance D from an upper end in first direction X of the front cover 70.

Preferably, the upper end 103 in first direction X of the second portion 102 may be positioned behind the light-emitting surface 54 of the plurality of inorganic light-emitting devices 50 in the first direction X.

The reason may be because the side end member 100 is positioned in the gap G, as described above, and accordingly, in a case in which the upper end 103 of the second portion 102 of the side end member 100 is positioned in front of the light-emitting surface 54 in the first direction X, the upper end 103 may be recognized as a seam formed between the display modules 30A to 30P by light emitted from the plurality of inorganic light-emitting devices 50.

Accordingly, the upper end 103 of the second portion 102 in the first direction X may be spaced the preset distance D from the upper end of the front cover 70 in the first direction X, thereby reducing recognition of a seam, which may be generated according to driving of the display modules 30A to 30P.

The side end member 100 may be in a form of a thin film. The reason may be because the side end member 100 is positioned in the gap G formed between the display modules 30A to 30P upon tiling of the display modules 30A to 30P. A great thickness of the side end member 100 may require a great gap G formed between the display modules 30A to 30P, which may cause recognition of a seam between the display modules 30A to 30P.

Accordingly, the side end member 100 may be a thin film having a small thickness. Preferably, the side end member 100 may have a thickness t of 10 μm or less.

Preferably, the preset distance D between the upper end 103 of the second portion 102 in the first direction X and the upper end of the front cover 70 in the first direction X may be 10 times longer than the thickness t of the side end member 100.

A ratio 1/10 of the thickness t with respect to the preset distance D may be a ratio for minimizing recognition of a seam that may be generated between the display modules 30A to 30P, by a user who observes the display modules 30A to 30P in front of the display apparatus 1. That is, the ratio may be a ratio for minimizing recognition of a seam according to the thickness t of the side end member 100 or a length of the side end member 100 in the first direction X by considering the size of the plurality of inorganic light-emitting devices 50 in unit of μm.

The side end member 100 may be formed of a material having high conductivity. For example, the side end member 100 may be formed of a material, such as a metal, a conductive polymer, a conductive fabric, etc., which is capable of being electrically grounded to the metal plate 60.

The side end member 100 may be formed of a material having higher conductivity than the side cover 90. Also, the side end member 100 may be formed of a material having higher conductivity than the front cover 70.

Accordingly, as shown in FIG. 10, current E1 generated by an electrostatic discharge E1' on the front cover 70 may not enter the substrate 40 because the current E1 is not transmitted through the front cover 70, and the current e1 may float on the front cover 70 to enter the side end member 100.

The current e1 entered the side end member 100 may enter the metal plate 60 through the side end member 100. The reason may be because the side end member 100 is in contact with the metal plate 60 and grounded to the ground component.

The side end member 100 may provide a current path for causing the current E1 generated by the electrostatic discharge E1' on the front cover 70 to flow to the metal plate 60 provided as the ground component.

In other words, the side end member 100 may guide charges generated by an electrostatic discharge to the ground.

Also, current E2 generated by an electrostatic discharge E2' on the side end member 100 or the side cover 90 may not enter the substrate 40 because the current e2 is not transmitted through the side cover 90, and the current E2 may enter the side end member 100 and then flow to the metal plate 60.

At least some current of the current E1 generated by the electrostatic discharge E1' on the front cover 70 or the current E2 generated by the electrostatic discharge E2' on the side cover 90, as described above, may remain on the front cover 70 or the side cover 90, instead of flowing to the side end member 100, and the remaining current may be transmitted through the front cover 70 and the side cover 90 and then enter the substrate 40.

However, because a major part of the current E1 generated by the electrostatic discharge E1' on the front cover 70 or the current E2 generated by the electrostatic discharge E2' on the side cover 90 flows to the metal plate 60 through the side end member 100 having high conductivity, ESD internal pressure of the electronic components mounted on the substrate 40 may be improved although some of the current E1 or E2 flows to the substrate 40.

Also, although sealing of the front cover 70 and the side cover 90 is insufficient due to a defect generated in a process of manufacturing the display modules 30A to 30P, as described above, or although current is generated by an electrostatic discharge on the front cover 70 or the side cover 90, current may be induced to the side end member 100 having high conductivity, and accordingly, ESD internal pressure of the electronic components mounted on the substrate 40 may be improved.

In addition, electrostatic current transferred to the metal plate 60 may escape to an external ground through a component, such as a bridge board or a cable, being in contact with the metal plate 60.

The side end member 100 may have a dark color. Preferably, the side end member 100 may have a black color. The side end member 100 may have a darker color than the front cover 70.

Preferably, the side end member 100 may have a color that is similar to that of the black matrix 48 or the side cover 90.

Accordingly, light entered the side end member 100 may be absorbed in the side end member 100 without being reflected.

As described above, each of the display modules 30A to 30P may independently include the front cover 70, the side cover 90, the metal plate 60, and the side end member 100 to prevent current generated according to an electrostatic discharge from entering each of the display modules 30A to 30P.

Accordingly, after the front cover 70, the side cover 90, the metal plate 60, and the side end member 100 are installed in each of the display modules 30A to 30P, the display modules 30A to 30P may be protected against current generated by an electrostatic discharge that may occur in subsequent manufacturing processes or transfer processes. Particularly, although the front cover 70 and the side cover 90 insufficiently seal the substrate 40 due to a defect generated in a manufacturing process, the side end member 100 may easily guide current to the metal plate 60, and accordingly, the display modules 30A to 30E may be protected against current generated by an electrostatic discharge. Hereinafter, a side end member 100' of the display module 30 according to another embodiment of the disclosure will be described. The other components of the display apparatus 1 except for the side end member 100' which will be described below are the same as the corresponding ones of the display apparatus 1 described above, and therefore, overlapping descriptions thereof will be omitted.

Figure 11:
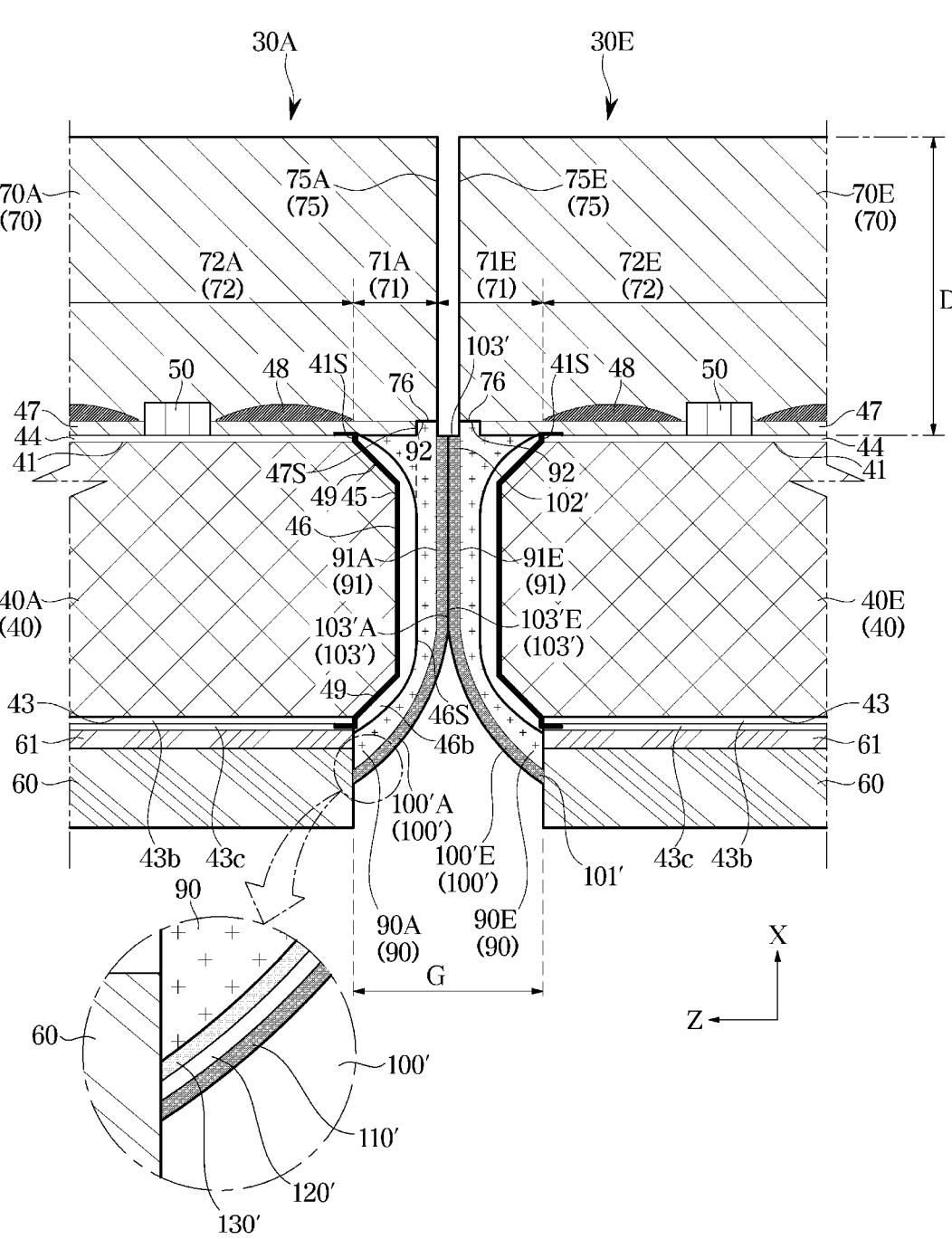
FIG. 11 is an enlarged cross-sectional view of some components of a display apparatus according to another embodiment of the disclosure, taken along the third direction.

FIG. 11 is an enlarged cross-sectional view of some configurations of a display apparatus according to another embodiment of the disclosure, taken along the third direction.

As shown in FIG. 11, the side end member 100' may include three layers 110', 120', and 130'.

The side end portion 100' may include a first layer 130' being in contact with the side cover 90, a second layer 120' having high conductivity and grounded to the metal plate 60, and a third layer 110' having a dark color to absorb light entered the side end member 100'.

The first layer 130' may be a layer for bonding the side end member 100' to the side cover 90, and may be provided as an adhesive, an adhesive tape, or the like.

The second layer 120' may be provided as a metal film having high conductivity, although not limited thereto. However, the second layer 120' may be provided as a conductive polymer, a conductive fabric, etc.

The third layer 110' may absorb light entered the side end member 100' to prevent recognition of a seam from being raised by the side end member 100'.

The third layer 110' may be formed of a light absorbing material. The third layer 110' may have, preferably, a black color to absorb light. The third layer 110' may have a color corresponding to the side cover 90 or the black matrix 48.

The first, second, and third layers 110', 120', and 130' may overlap sequentially outward from the side surface 45. Accordingly, the second layer 120' may cover the first layer 130' from the outside, and the third layer 110' may cover the second layer 120' from the outside.

Accordingly, only the third layer 110' of the side end member 100' may be exposed to the outside, and the side end member 100' may absorb external light through the third layer 110'.

That is, although a conductive material of the second layer 120' grounded to the metal plate 60 may be recognized as a seam, the third layer 110' covering the second layer 120' may lower recognition of a seam.

Hereinafter, a side end member 200 of the display module 30 according to another embodiment of the disclosure will be described. The other components except for the side end member 200 which will be described below are the same as the corresponding ones of the display apparatus 1 described above, and therefore, overlapping descriptions thereof will be omitted.

Figure 12:
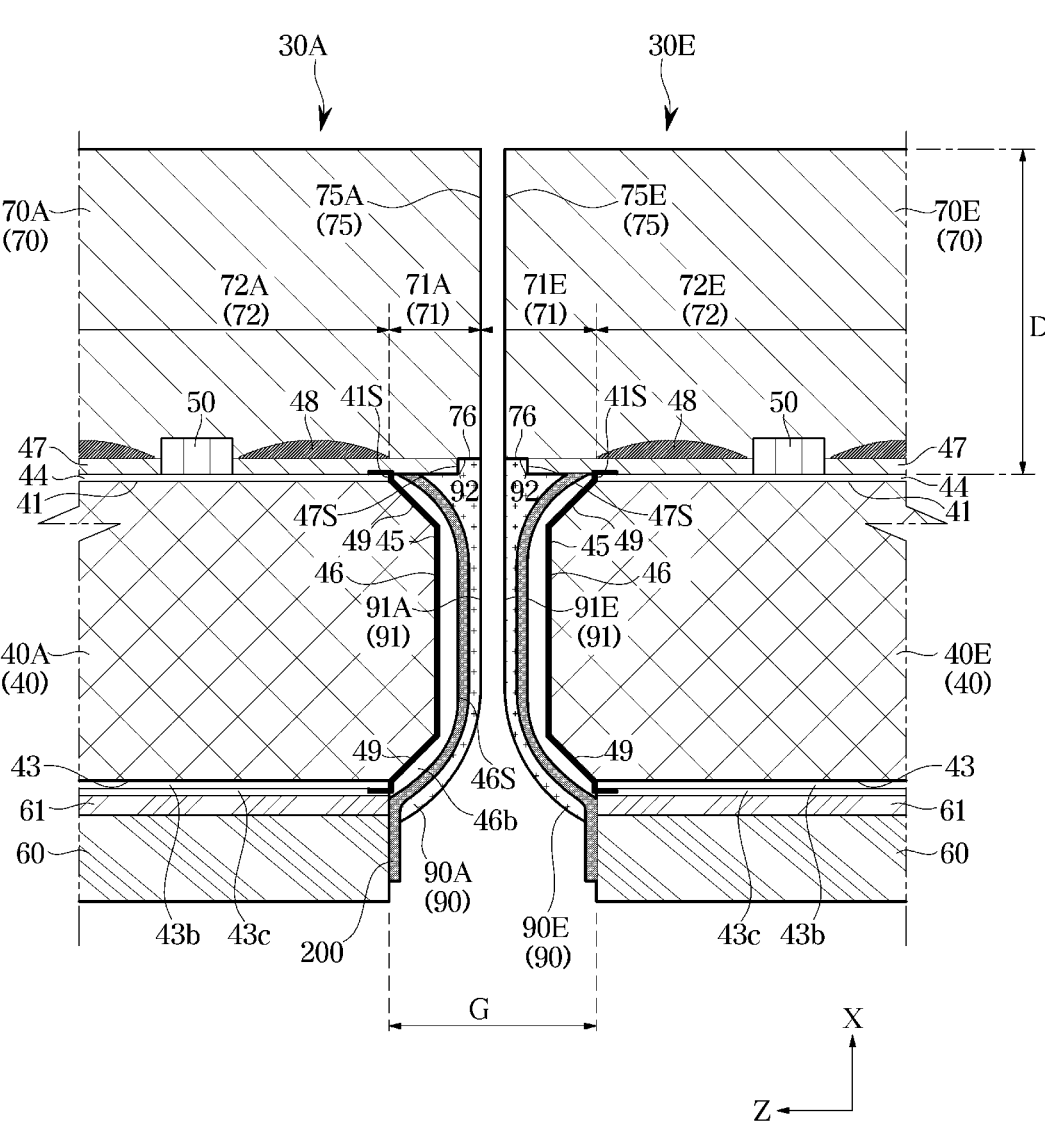
FIG. 12 is an enlarged cross-sectional view of some components of a display apparatus according to another embodiment of the disclosure, taken along the third direction.

FIG. 12 is an enlarged cross-sectional view of some components of a display apparatus according to another embodiment of the disclosure, taken along the third direction.

As shown in FIG. 12, a portion of the side end member 200 may be in contact with the metal plate 60 to be grounded to the metal plate 60, and another portion of the side end member 200 may be positioned inside the side cover 90.

The side end member 100 according to an embodiment of the disclosure as described above may be positioned on the outer side of the side surface 90, whereas the side end member 200 according to another embodiment of the disclosure may be positioned inside the side cover 90.

The reason may be to prevent the side end member 200 from being exposed to the outside and recognized.

Because the side end member 200 is positioned inside the side cover 90, in a case in which the front cover 70 and the side cover 90 insufficiently seal the substrate 40 due to a defect generated in a process of manufacturing the display modules 30A to 30P, current generated by an electrostatic discharge may be guided to the side end member 200 positioned inside the side cover 90 and thus flow to the metal plate 60 although the current flows to the inside of the front cover 70 or the side cover 90, and accordingly, ESD internal pressure of the electronic components mounted on the substrate 40 may be improved.

The display apparatus according to an embodiment of the disclosure may obtain a seamless effect of preventing visibility of a seam by absorbing light entered a gap between neighboring display modules.

The display apparatus according to an embodiment of the disclosure may be sealed by the front cover positioned on the front side of each of the display modules, the side cover positioned on the side surface, and the metal plate positioned on the rear surface, and improve ESD internal pressure by the side end member additionally positioned on the side surface and grounded to the metal plate against an electrostatic discharge that may be generated in the display modules during processes of manufacturing the display modules and transferring the display modules and after the display modules are assembled into the display apparatus.

Although the technical concept of the disclosure has been described based on specific embodiments, the scope of rights of the disclosure is not limited to these embodiments. It should be interpreted that various embodiments modified or changed by a person skilled in the art within a scope not deviating from the gist of the disclosure as the technical concept of the disclosure, which is defined in the claims, also belong to the scope of rights of the disclosure.

What is claimed is:

1. A display module comprising:
a substrate comprising a mounting surface on which a plurality of inorganic light-emitting devices are mounted, a side surface, and a rear surface being opposite to the mounting surface;
a front cover bonded with the mounting surface and covering the mounting surface;
a metal plate bonded with the rear surface;
a side cover covering the side surface; and a side end member covering at least one portion of a side end of the side cover and being spaced apart from the front cover in a direction in which the mounting surface faces, the side end member comprising a first portion in contact with and grounded to the metal plate and a second portion connected to the first portion and positioned on the side end of the side cover,
wherein the side end member extends from the first portion to the second portion in the direction in which the mounting surface faces.

2. The display module of claim 1, wherein a conductivity of the side end member is greater than a conductivity of the side cover.

3. The display module of claim 1, wherein an end of the first portion in the direction in which the mounting surface faces is spaced at a distance from a front end of the front cover in the direction in which the mounting surface faces.

4. The display module of claim 3, wherein the end of the first portion in the direction in which the mounting surface faces is positioned behind a light-emitting surface of the plurality of inorganic light-emitting devices in the direction in which the mounting surface faces.

5. The display module of claim 3, wherein the distance between the end of the first portion and the front end of the front cover is ten times longer than a thickness of the side end member.

6. The display module of claim 1, wherein the side end member is formed with a color of black.

7. The display module of claim 1, wherein the side end member is made of metal.

8. The display module of claim 1, wherein the side end member comprises a first layer bonded with the side cover, a second layer grounded to the metal plate, and a third layer formed with a color of black, and
the first layer, the second layer, and the third layer are sequentially layered outward from the side surface.

9. The display module of claim 1, wherein the side cover comprises a light absorbing material.

10. The display module of claim 1, wherein the side cover is formed of a nonconductive material.

11. The display module of claim 1, wherein the front cover is provided to extend to an area outside the mounting surface.

12. The display module of claim 11, wherein the side cover extends from an upper portion of the metal plate to a lower end of the area outside the mounting surface of the front cover in the direction which the mounting surface faces, to seal the side surface from outside.

13. The display module of claim 1, wherein a side end of the front cover and the side end of the side cover are linearly aligned.

14. The display module of claim 1, wherein the side surface corresponds to four edges of the mounting surface,
the front cover extends up to an outer location than the four edges of the mounting surface,
the side cover surrounds the side surface, and a lower surface of the front cover, corresponding to outside of the mounting surface, along the four edges of the mounting surface, and
the side end member surrounds at least one portion of the side cover, along the four edges of the mounting surface.

15. A display apparatus comprising:
A display module array of a plurality of display modules are arranged in a two-dimensional matrix, each of the plurality of display modules comprising:

a substrate comprising a mounting surface on which a plurality of inorganic light-emitting devices are mounted, a side surface, and a rear surface being opposite to the mounting surface, a front cover bonded with the mounting surface and covering the mounting surface, a metal plate bonded with the rear surface, a side cover covering the side surface, and a side end member covering at least one portion of a side end of the side cover and being spaced apart from the front cover in a direction in which the mounting surface faces, the side end member comprising a first portion in contact with and grounded to the metal plate and a second portion connected to the first portion and positioned on the side end of the side cover, wherein the side end member extends from the first portion to the second portion in the direction in which the mounting surface faces; and a frame configured to retain the plurality of display modules in the two-dimensional array.

16. The display apparatus of claim 15, wherein a conductivity of the side end member is greater than a conductivity of the side cover.

17. The display apparatus of claim 15, wherein an end of the first portion in a direction in which the mounting surface faces is spaced at a distance from a front end of the front cover in the direction in which the mounting surface faces.

18. The display apparatus of claim 17, wherein the end of the first portion in the direction in which the mounting surface faces is positioned behind a light-emitting surface of the plurality of inorganic light-emitting devices in the direction in which the mounting surface faces.

19. A display module comprising:

a substrate including a mounting surface on which a plurality of inorganic light-emitting devices are mounted, a side surface, and a rear surface being opposite to the mounting surface;

a metal plate bonded with the rear surface;

a side cover covering the side surface; and a side end member covering at least one portion of a side end of the side cover and being spaced apart from the front cover in a direction in which the mounting surface faces, the side end member (i) being formed of a material having higher conductivity than the side cover grounded to the metal plate, and (ii) extending from at least one portion of the metal plate to the at least one portion of the side cover in the direction in which the mounting surface faces.

* * * * *